(12) United States Patent
Garvey et al.

(10) Patent No.: US 6,797,336 B2
(45) Date of Patent: Sep. 28, 2004

(54) MULTI-COMPONENT SUBSTANCES AND PROCESSES FOR PREPARATION THEREOF

(75) Inventors: James F. Garvey, Williamsville, NY (US); Gary S. Tompa, Belle Mead, NJ (US); Stuart G. MacDonald, Pultneyville, NY (US); Robert L. DeLeon, Williamsville, NY (US)

(73) Assignee: AMBP Tech Corporation, Amherst, NY (US)

( * ) Notice: Subject to any disclaimer, the term of this patent is extended or adjusted under 35 U.S.C. 154(b) by 0 days.

(21) Appl. No.: 10/186,826

(22) Filed: Jul. 1, 2002

(65) Prior Publication Data

US 2003/0121887 A1 Jul. 3, 2003

Related U.S. Application Data

(63) Continuation-in-part of application No. 09/853,006, filed on May 10, 2001, said application No. 10/186,826, is a continuation-in-part of application No. 10/058,362, filed on Jan. 28, 2002, now Pat. No. 6,613,198
(60) Provisional application No. 60/277,993, filed on Mar. 22, 2001, and provisional application No. 60/284,226, filed on Apr. 18, 2001.

(51) Int. Cl.[7] .............................................. C23C 14/28
(52) U.S. Cl. ...................... 427/561; 427/562; 427/563; 427/564; 427/569; 427/576; 427/577; 427/578; 427/580; 427/586; 427/596; 427/597; 427/249.19; 427/255.28; 427/255.29
(58) Field of Search ................................. 427/561–564, 427/569, 576–578, 580, 586, 596, 597, 249.19, 255.28, 255.29

(56) References Cited

U.S. PATENT DOCUMENTS

| | | | |
|---|---|---|---|
| 4,966,887 A | * | 10/1990 | Garvey ....................... 505/474 |
| 5,523,006 A | | 6/1996 | Strumban |
| 5,593,740 A | | 1/1997 | Strumban et al. |
| 6,090,207 A | * | 7/2000 | Knauss et al. .............. 118/715 |
| 6,221,330 B1 | | 4/2001 | Moy et al. |
| 6,261,424 B1 | | 7/2001 | Goncharenko et al. |
| 6,277,318 B1 | | 8/2001 | Bower et al. |
| 6,600,127 B1 | | 7/2003 | Peterson et al. |
| 2002/0066720 A1 | * | 6/2002 | Ha et al. ................. 219/121.6 |
| 2003/0230554 A1 | | 12/2003 | Schroder et al. |

FOREIGN PATENT DOCUMENTS

WO  WO 92/13113  *  8/1992

OTHER PUBLICATIONS

Deleon et al., "Thin Film Formation by Laser–Assited Molecular Beam Deposition", ACS Symposium Series 679, Nanostructure Materials, Apr. 13–17, 1997, San Francisco, CA, pp. 183–197.*

(List continued on next page.)

*Primary Examiner*—Timothy Meeks
(74) *Attorney, Agent, or Firm*—Howard J. Greenwald P.C.; John M. Hammond

(57) ABSTRACT

The present invention is a method and apparatus for the synthesis of multi-component substances, comprising entities of at least two elements, molecules, grains, crystals, structural units, or phases of matter, in which the scale of the distribution of the elements, molecules, or phases of matter may range from on the order of nanometers or less, to about one millimeter, depending upon the specific materials and process conditions that are chosen. The method and apparatus of the present invention further provides processes for preparing these compositions of matter as thin films or particles.

49 Claims, 15 Drawing Sheets

OTHER PUBLICATIONS

Rexer et al., Review of Scientific Instruments, vol. 71, No. 5, May 2000, pp. 2125–2130.*

Wijekoon; Lyktey; Prasad; Garvey, "Characterization of copper iodide thin films fabricated via laser–assisted molecular–beam deposition", J Appl. Phys. 74 (9), Nov. 1, 1993, c. 1993. p. 5267–5772.

Wijekoon; Lyktey; Prasad; Garvey, The nature of copper thin films of coppper iodide grown y laser–assisted molecular beam deposition: comparative ESCA and EDXS studies, J. Phys. D: Appl. Phys. 27 (1994) IOP Publishing LTD; p. 1548–1555.

Wijekoon; Prasad; Garvey; Fabrication of zinc oxide, titanium oxide and organic entrapped silica thin films via Laser Assisted Molecular Beam Deposition; c. 1995 SPIE vol. 2403 p. 143–152.

Wijekoon; Lyktey; Prasad; Garvey, "Fabrication of a thin film of an inorganic organic composite via laser asisted molecular beam deposition"; Appl. Phys. Lett. 67 (12) Sep. 18, 1995; c. 1995 American Institute of Physics, p. 1698–1699 p. 1698 para. 2.

Deleon; Sun; Rexer; Charlebois; Garvey; Forsythe; Tompa, Laser assisted molecular beam deposition of Si, C, and SiC films; Mat. Res. Soc. Symp. vol. 441 c.1997 Materials Research Society; p. 573–578 (exp Proc. Figs 1 and 2).

Deleon; Prasad; Garvey, "Thin Film Formation by Laser-–Assisted Molecula Beam Deposition"–Shalev, Ed.; Moskovits, Ed., "Nanostructured Materials; Clusters, Composites, and Thin Films," ACS Symposium Series 679, ACS (Washington, DC; US), (Apr. 25, 1997).

Rexer; Joshi; Deleon; Prasad; Garvey, "A reactive laser ablation source for the production of thin films," Review of Scientific Intruments, 1998 American Institute of Physics; vol. 69, No. 8 pp. 3028–3030. Sec. II & III, Fig 1.

Deleon; Joshi; Rexer; Prasad; Garvey; "Progress in thin film formation by assisted molecular beam deposition (LAMB-D)";Applied Surface Science 127–129 (1998) 321–329 (2 experimental).

Deleon; Joshi; Rexer; Prasad; Garvey; "Up–converted emission observed from hybrid inorganic:organic composite thin film generated via laser assisted molecular beam"; SPIE vol. 4106 (c. 2000) p. 289–299.

Sugai; Omote; Bandow; Tanaka;Shinohara, "Production of fullerenes and single–wall carbon nanotubes by high–temperature pulsed arc discharge" Journal of Chemical Physics, vol. 112, 6000, 2000.

Rexer; Wilbur; Mills; Deleon; Garvey, "Production of metal oxide thin fims by pulsed arc molecular," Review of Scientific Instruments, American Institute of Physics (US), vol. 71 (No. 2), p. 2125–2130, (Apr. 25, 2000).

Cheung; Kurtz; Park; Lieber, "Diameter–Controlled Sythesis of Carbon Nanotubes," J. Phys. Chem. B, ACS (Washington, DC, US), p. 2429–2433, (Apr. 25, 2002).

* cited by examiner

MULTI-COMPONENT SUBSTANCES AND PROCESSES FOR PREPARATION THEREOF

CROSS-REFERENCE TO RELATED PATENT APPLICATIONS

This application is a continuation-in-part of copending patent application U.S. Ser. No. 09/853,006, filed on May 10, 2001 pending, which claims the benefit of the filing date of U.S. provisional patent application Ser. No. 60/277,993 filed Mar. 22, 2001.

This application is also a continuation-in-part of copending patent application U.S. Ser. No. 10/058,362, filed on Jan. 28, 2002 now U.S. Pat. No. 6,613,198, which claims the benefit of the filing date of U.S. provisional patent application Ser. No. 60/284,226, filed on Apr. 18, 2001.

STATEMENT OF GOVERNMENT SUPPORT OF THE INVENTION

The invention herein was supported by Department of Defense BMDO Phase 1 SBIR Contract No. DAAG55-97-C-0038.

FIELD OF THE INVENTION

Compositions of matter comprising at least two elements, molecules, grains, crystals, structural units, or phases of matter, and more particularly to metal alloys, mixtures of metals and metal oxides, mixed composition semiconductors, and mixed organic and inorganic substances, wherein the scale of mixing of the reactants may be on the order of nanometers or less; and wherein the resulting distribution of elements, molecules grains, crystals, structural units, or phases of matter may range from nanometers to about one millimeter; and processes for preparing these compositions of matter as thin films or particles.

BACKGROUND OF THE INVENTION

There is a large demand for multi-component substances across a range of technological and industrial applications. These multi-component substances may be required for particular applications as thin films for use in optical and opto-electronic devices, as insulating and diffusion barriers in silicon-on-insulator electronic devices, chemical sensors, MEMs, pyroelectrics and superconducting films among others. Alternatively, such multi-component substances may be required for other applications as fine particles, or powders, for use in structural materials, pharmaceuticals, medical devices, separation processes, catalysis, and others.

The present invention provides a method and apparatus for the synthesis of multi-component substances, comprising entities of at least two elements, molecules, grains, crystals, structural units, or phases of matter, in which the scale of the distribution of the elements, molecules, or phases of matter may range from on the order of nanometers or less, to about one millimeter, depending upon the specific materials and process conditions that are chosen. The method and apparatus of the present invention further provides processes for preparing these compositions of matter as thin films or particles. The present invention additionally provides examples of such substances.

In regard to the term "multi-component", as used herein, a "component" is defined as an entity, which is either a discontinuous material distributed throughout another material; or a generally continuous material, through which is distributed other materials. Thus, in the present invention, a component may be a pure element, distributed throughout or coated upon a general continuous phase of matter, such as titanium metal, cerium metal, silicon, or other elements. A component may be a molecular substance, or an inorganic or ionic compound distributed throughout or coated upon a general continuous phase of matter, such as gallium nitride, silicon carbide, zinc oxide, titanium nitride, cerium oxide, hafnium oxide, and the like. A component may be a grain or crystal structure within a metal alloy wherein different grains or crystals within the alloy comprise different compositions, e.g. a particular metal that has a specifically advantageous grain structure. A component may be a first structural unit of matter, distributed throughout a second phase of matter, e.g. fibers, nanotubes, or nanospheres distributed throughout e.g. a polymer, a glass, and the like, such as a catalytic metal distributed within a matrix structure; or cerium oxide ($CeO_2$, or $Ce_2O_3$) or silicon oxide ($SiO_x$, where x is 1 or 2). A component may be an inorganic phase of material distributed throughout or coated upon an organic phase of matter, or vise versa, such as an organic dye condensed within a continuous inorganic thin film; or a dye embedded in an inorganic matrix; or sequentially layered combinations of such films. A component may be a substantially continuous phase of matter through which other components are distributed or coated upon as defined above.

The single feature in common with all of the above variants of components is that they each are products resulting from the process of the present invention. Accordingly, novel materials produced by the process of the present invention may comprise two or more components selected from elements, molecules, inorganic or ionic compounds, grains, crystals, structural units, and phases. The components, while most often being present as solids, may also exist as liquids or gases in the materials of the present invention.

The unique capabilities of the energy assisted molecular beam deposition processes of the present invention, including pulsed arc molecular beam deposition (PAMBD), laser assisted molecular beam deposition (LAMBD), and electron beam assisted molecular beam deposition (EAMBD), enable the instantaneous mixing of reactive chemical species on a molecular scale, such that the resulting film or powder products have uniform repeating structures distributed through them which may range from nanometers or less, to about one millimeter. For example, metal alloys with extremely fine grain structure can be produced by the PAMBD process. Such unique metal alloys are valuable as e.g. heterogeneous catalysts, sensor elements, and high strength materials.

Mixed organic and inorganic matrices may also be synthesized in thin film or particulate form. For example, one may synthesize metal/metal oxide films doped with organic or covalent molecules; or metal/metal oxide particles coated with organic films. One may further synthesize an organic dye or pigment encased within a metal oxide matrix. Such materials prepared as thin films are known to possess non-linear optical properties, which are useful in photonic applications. Other such materials, comprising an organic photoconductive material dispersed in a second electron and/or hole transporting material, are useful in the practice of electrophotography.

The process of the present invention may also be used to synthesize films of mixed composition semiconductors, which comprise tunable band gap materials. For example, one could synthesize a film comprising gallium nitride and scandium gallium nitride in various proportions. Such tunable band gap semiconductors are useful as blue, white, or short wavelength display and sensor devices, photon emitters or detectors, and transistors, used in the display, lighting, sensing, communications, and electronics industries.

Multi-layer films on the order of nanometers thick may also be synthesized by the process of the present invention. Such films of alternating layer composition are useful as e.g., low pass, high pass, or cutoff optical filters, and sensor elements.

In all of these cited examples of the present invention, the compositions of matter and the material properties obtained are difficult or impossible to obtain using material synthesis, film coating, and particulate generating processes of the prior art. For example, there is currently no satisfactory method to generate high optical quality scandium gallium nitride and other gallium nitride based materials. The pulsed arc molecular beam and laser assisted molecular beam processes of the present invention are superior in producing these materials, and many other materials.

It is therefore an object of this invention to provide a simple process for the synthesis and deposition of thin films comprising multi-component substances with an ordered structure on the scale of between one nanometer and one millimeter.

It is a further object of this invention to provide a simple process for the synthesis and harvesting of powders comprising multi-component substances with an ordered structure of between one nanometer and one millimeter.

It is another object of this invention to provide a process for the synthesis and deposition of thin films comprising multicomponent substances with an amorphous or disordered structure.

SUMMARY OF THE INVENTION

In accordance with the present invention, there is provided a process for making a multi-component substance of at least two elements, molecules, grains, crystals, structural units, or phases of matter, wherein the scale of distribution of elements, molecules, inorganic or ionic compounds, grains, crystals, structural units, or phases of matter is on the order of nanometers or less, to as much as one millimeter, comprising the steps of applying energy from an energy source to a first target assembly wherein said first target assembly is comprised of a first material and a second material, ablating said first material from said first target assembly and generating a first plasma, ablating said second material from said first target assembly and generating a second plasma, discharging a flow of reagent gas from a gas supply toward said first plasma, discharging a flow of reagent gas from a gas supply toward said second plasma, reacting said first plasma and said second plasma to produce a multi-component substance, discharging a flow of reagent gas from a gas supply toward said harvesting device, and harvesting said multi-component substance with said harvesting device.

One aspect of the invention is based on the discovery of techniques to simultaneously utilize a high temperature plasma source as a chemical reactor, and as a molecular beam. This technique enables the generation of unique combinations of reactants in a highly energetic, yet controlled environment, such that novel reaction products are produced. These novel materials may be collected as thin films on a substrate, or harvested as fine powders.

Such techniques can be generally implemented, by applying energy from an energy source upon a target material, which produces a plasma within a generation chamber or localized zone or localized region. Concurrently, a pulse of reagent gas is directed into the generation chamber, which mixes with the plasma, and which subsequently transports the mixture into a deposition/harvesting chamber. There is a vast array of candidate target materials and reagent gases which may be selected as reactants. Accordingly, a considerable range of novel materials may be produced by the process of the present invention.

A further aspect of the invention is based on the observation of problems with conventional energy-driven material processes performed in vacuo. For example, pulsed laser deposition (PLD) is a process in which a target material is simply ablated within a chamber, in proximity to a substrate. Coating of the substrate with ablated material occurs. However, the PLD process typically produces a volcanic-like eruption of vapor, fine particles, and larger debris from the target surface, resulting in a film or powder of non-uniform chemical composition and morphology. In contrast, the process of the present invention produces a controlled generation of target material into a plasma, and a controlled transport of the target material to a substrate or into a harvesting chamber. The resulting film and/or powder materials produced by the present invention are superior to those achieved by processes of the prior art in that they are more uniform in chemical composition and in morphology. In addition, the process of the present invention enables the synthesis of a multi-component substance of at least two elements, molecules, inorganic or ionic compounds, grains, crystals, structural units, or phases of matter, wherein the scale of distribution of elements, molecules, inorganic or ionic compounds, grains, crystals, structural units, or phases of matter may range from nanometers or less to about one millimeter.

The technique described above is therefore advantageous because it enables the synthesis of a broad range of high purity materials with ordered nanostructures, which provide the materials with useful properties. The materials may be synthesized as powders or as thin films, which further provide the materials with useful functions.

BRIEF DESCRIPTION OF THE DRAWINGS

The invention will be described by reference to the following drawings, in which like numerals refer to like elements, and in which.

Figure 1:
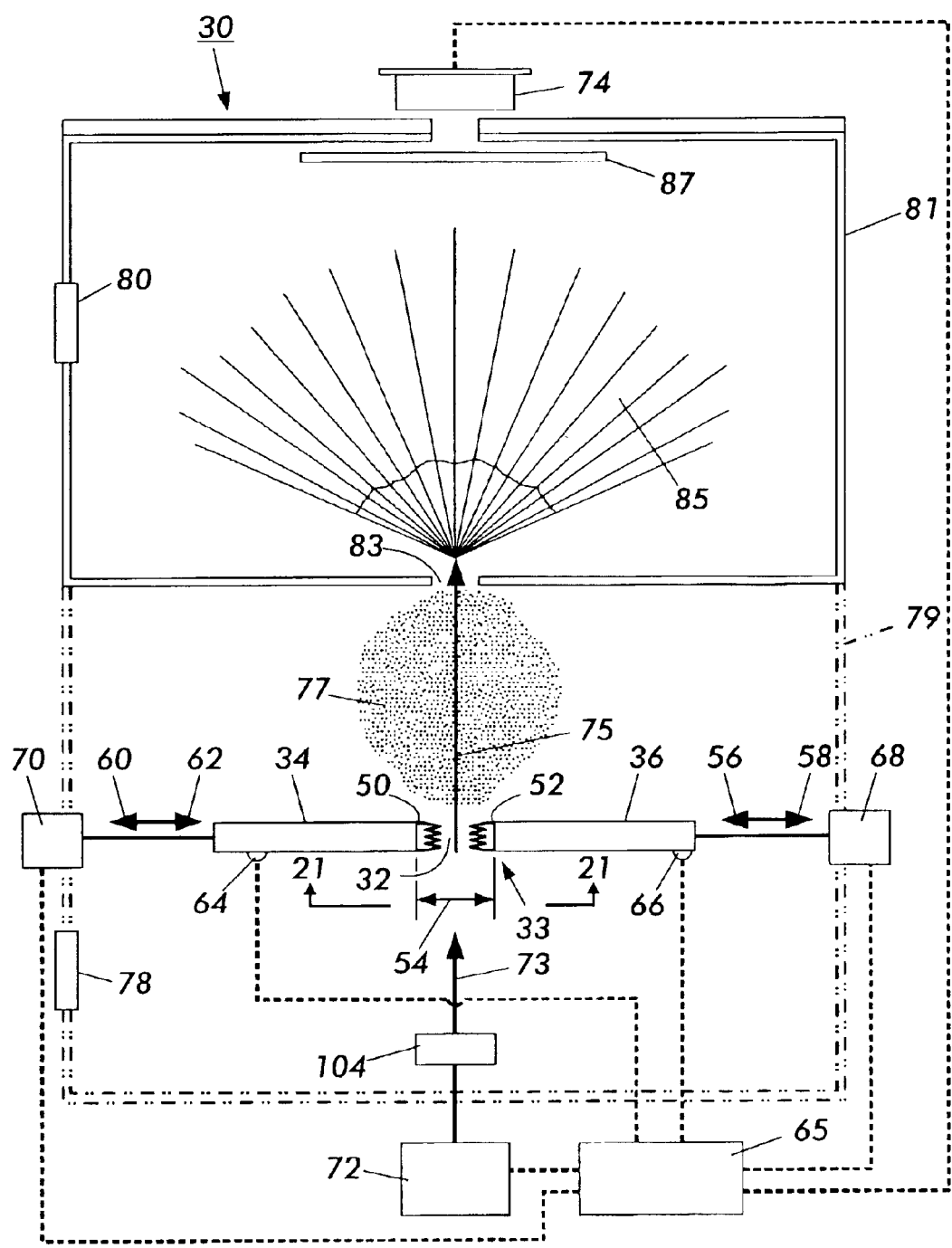
FIG. 1 is a schematic representation of one preferred process for carrying out pulsed arc molecular beam deposition (PAMBD), for making single or multi-component substances, in accordance with the present invention.

The present invention will be described in connection with a preferred embodiment, however, it will be understood that there is no intent to limit the invention to the embodiment described. On the contrary, the intent is to cover all alternatives, modifications, and equivalents as may be included within the spirit and scope of the invention as defined by the appended claims.

DESCRIPTION OF THE PREFERRED EMBODIMENTS

For a general understanding of the present invention, reference is made to the drawings. In the drawings, like reference numerals have been used throughout to designate identical elements. In describing the present invention, the following term(s) have been used in the description.

In a first part of this specification, and by reference to FIGS. 1 through 8, certain of the subject matter of applicants' copending patent application Ser. No. 09/853,006, filed on May 10, 2001, will be described. Thereafter, in a second part of this specification, certain of the subject matter of applicants' copending patent application U.S. Ser. No. 10/058,362, filed on Jan. 28, 2002 will be described. Thereafter, in a third part of this specification, other embodiments of the invention will be described.

FIG. 1 illustrates schematically the apparatus 30 for carrying out pulsed arc molecular beam deposition of a thin film or powder that includes a vacuum chamber 81, which is evacuated by a vacuum pump (not shown). A gas source 72 will deliver a pulse of gas into vacuum chamber 79 when a pulsed valve 104 is activated. Also disposed within chamber 81 is the substrate 87 on which the material is to be deposited. Mounted in a housing (not shown) are an anode 34 and a cathode 36 which are comprised of the material to be deposited. A window 80 permits viewing of the deposition process. Chamber 79 and chamber 81 are preferably separate chambers, in communication with each other through orifice 83. Chamber 79 is typically operated at $10^2$ Torr, while chamber 81 is operated at between $10^{-4}$ Torr and $10^{-2}$ Torr. The flow of gas and reaction products is therefore from low vacuum chamber 79 to high vacuum chamber 81.

If, for example, a metal oxide thin film is to be deposited, the thin film starting materials are a reactive gas, such as $O_2$, and a pair of conducting electrodes composed of the pure metal of interest. A high voltage electrical discharge, 1000 V, is struck between the pair of electrodes (anode 34 and cathode 36) inside vacuum chamber 79. The discharge energy is estimated at 1.5 J/pulse. The distance between electrodes 34 and 36 is kept between 1 and 3 mm for typical experiments. Prior to triggering the electrical discharge, a gas is pulsed by pulsed valve 104 between the ends of cylindrical electrodes 34 and 36. The gas is synchronously pulsed with the pulsing of the electrical discharge, i.e. pulsed valve 104 operates at the same frequency as the pulsing of the electrical discharge. However, the gas pulse preferably lasts two orders of magnitude longer than the arc pulse, so a relatively high pressure is established inside the PAMBD zone or region prior to the discharge and continues during and after the discharge arc plasma is produced.

Relative to the high vacuum, $10^{-6}$ mbar, environment of vacuum chamber 79, the gas pulse creates a sufficient pressure between electrodes 34 and 36 to support a cold cathode electric discharge. Cold cathode field emission is spontaneous emission of electrons from inside a cold cathode to the space outside of the cathode. In the case being discussed, the discharge occurs between an electrode pair in the zone or region. The emission has been shown to start at "whisker-like" surface imperfections with an approximate 0.5-micron radius on the cathode surface. The electric field can be two orders of magnitude larger than the average field of the cathode on these imperfections. With these enhanced local fields, some electrons will spontaneously tunnel into the vacuum.

Dielectric imperfections embedded in a cathode or dielectric coating on part of a cathode can also support high local electric fields. A common way to initiate arcing is to form a triple junction on the cathode. Adding dielectric material or coating part of the cathode with a dielectric material allows high electric fields at the metal-dielectric-vacuum junction. Using a reactive gas, such as oxygen, creates a dielectric film on at least part of the electrodes of the PAMBD system, which is beneficial to its operation.

When a critical current density (about $10^{12}$ A/m$^2$) is achieved at a whisker-like emitter or triple junction, joule heating causes the cathode material to melt, sublimate, and evaporate. With a high local pressure of sublimated material and free electrons ionizing the background gas, a cascade of primary emission electrons, secondary electrons, and sublimated electrode material are accelerated across the electrode potential gap to the anode.

In the PAMBD process, this plasma also serves as the high-energy environment, which produces a chemical reaction between the ablated material and the gas. At favorable gap widths and source pressures, secondary ionization can form a bridge across the electrode gap to form a conducting bridge, represented by the Paschen curve. Around the minimum of the curve are values of pressure and electrode gap, which give the most abundant secondary electron emission from the source gas and favor plasma arc formation. When a conducting bridge is established across the gap, a capacitor can discharge across the gap.

In the PAMBD process, the gas pulse also moves the sputtered material from the discharge area and onto a substrate to create a thin film. Selecting a reactive gas to pulse through the ablated cathode material gives a chemically altered thin film of the starting cathode electrode material. The reactive gas also causes oxidation of the cathode, which produces more surface imperfections (more triple junctions).

A major advantage of the PAMBD is the low cost of the system relative to a pulsed laser deposition (PLD) system or a laser assisted molecular beam deposition (LAMBD) system. The entire PAMBD system can be built for a fraction of the current price of just the laser needed to operate a PLD system. Although the PAMBD system makes sense economically, it is limited in its materials capabilities compared to a laser ablation based system. Unlike PLD, which can use virtually any target rod, the PAMBD system is limited to electrically conducting materials.

Vacuum arc phenomena have been studied extensively for a century, but the process is not very well understood. The reason there is a lack of understanding of the basic process is that vacuum arcs are extremely sensitive to experimental conditions. A few important conditions are, but not limited to gas pressure, electrode temperature, cathode surface morphology, and electrode shape. As soon as an arc is initiated across a spark gap, the listed conditions change and continue to change during the arc's lifetime, therefore the arc's behavior changes constantly.

Once a discharge is established, the current flows through multiple hot spots on the cathode that are called cathode spots. In a cathode spot, current densities can vary widely depending on the conditions: a value of $10^8$ A/m$^2$ was given as a maximum value in one reference and $10^{12}$ A/m$^2$ in another reference.

After the discharge, cathode spots leave craters due to ablation that can vary in size. In scanning electron microscopy (SEM) studies of ablated cathode surfaces, craters greater than 10 $\mu$m in diameter are visible next to craters less than 1 $\mu$m. Crater size is dependent on the current and cathode surface properties. A clean unoxidized surface after ablation will have craters one to two times larger in diameter than a surface with a thick oxide coating. Along with smaller crater size, less molten droplet formation has been observed from the oxidized surfaces especially when ablated in the presence of a reactive background gas. For these reasons it is beneficial to operate the PAMBD system with a reactive gas to generate better quality films.

Cathode spot formation begins with a surface explosion probably at a surface imperfection or triple junction as mentioned earlier. Ions, electrons, and neutral species are ejected from the surface in a 1 ns time frame. The pressure of the local plasma is very high and it deforms the area directly adjacent to where the material was ejected. This area had undergone joule heating during the process of ejecting electrons, so it is probably in the liquid state. A crater is formed within approximately 5 ns of the explosion by the plasma pressure on the liquid. Molten droplets are formed within approximately 40 ns of the beginning of cathode spot formation, within approximately 40 ns the pressure causes the liquid to splash out of the plasma pressure formed crater. Approximately 40 ns is about the total lifetime of a cathode spot. The time for discharging the storage capacitor across the electrode gap in the PAMBD system was observed to be about 10 $\mu$s, so the discharge behavior reported for continuous dc discharge should be applicable to the PAMBD system.

The most probable angle of ejection of droplets from a 1 kA discharge from a copper electrode was observed to be about 20° for particles up to 80 $\mu$m in diameter with velocities in the maximum range of 700–800 m/s and much smaller velocities for larger droplets. Droplet ejection is thought to be the major cause of cathode erosion in low boiling point metals, but it is small in refractory metals such at Ti. The ejected droplets are heated in the plasma by free electron and ion bombardment, so they can sublimate, evaporate, or remain as droplets depending on the conditions. The droplets are thought to be the main source of neutrals in the interelectrode plasma. Typically, net cathode erosion rates depend strongly on current density, cathode surface condition, and cathode material. Some examples of observed rates are from 35 to 115 $\mu$g/C from copper cathodes to 30 to 52 $\mu$g/C for titanium electrodes.

The discharge in the PAMBD zone or region can be categorized as an intense arc. Visible anode spots, which can be observed on the anode during an intense arc, have been observed on the PAMBD anode. The spots are caused by large local current densities on the anode. The local current can cause ionization and evaporation of anode material and sputtering of droplets just as in the cathode spots. The ions ejected from the anode are thought to be ionized on the anode surface by energetic electrons from the cathode. Evaporated neutral species and droplets are caused by intense local heating on the anode.

Excluding the peripheral equipment, the PAMBD system can be broken down into two subsystems: The mechanical apparatus and the electrical system, which are illustrated as a block diagram in FIG. 2. The mechanical apparatus provides a clean vacuum environment for material deposition, shielding and containment of the electrical discharge, and mechanical positioning of the discharge electrodes. The electrical system consists of DC power supply 108, an energy storage capacitor and discharge circuit 110, and other triggering, timing, and safety components needed for operation.

The mechanical apparatus subsystem was designed as units bolted onto a high vacuum six-way cross which form vacuum chamber 79 of FIG. 1. Switching the position of the functional unit's placement on the cross offers multiple optional configurations.

Referring again to FIG. 2, an oil diffusion pump (or any equivalent pump, not shown) is bolted to the bottom flange of the six-way cross 112. The low vacuum port, pressure gauges, and bleed valve (not shown) are on the top of the six-way cross. Anode 34 and cathode 36 are located on opposite sides of the six-way cross 112. Each electrode unit consists of a high vacuum linear positioner and a high voltage feed through. The ceramic PAMBD source block is suspended on a vacuum flange into the middle of the six-way cross between the two electrodes. The electrodes enter the ceramic block from opposite sides and protrude into a cavity inside the block where the actual discharge takes place. The source flange also contains a pulsed valve connected to a gas source and a linear positioner for the ceramic block. On the final flange is 4 in. diameter window 78 (see FIG. 1). The window allows for optical plasma monitoring and visual troubleshooting of the process. The substrate to be coated is suspended in this leg of the cross by a spring mechanism that fits to the inside of the cross.

Referring again to FIG. 2, the electrical subsystem consists of six major units plus peripheral components. A high voltage dc power supply 108 converts 110 V alternating current into 1200 V direct current. A resistor bank is used to limit the charging current of the circuit. The resistor bank has 12 kΩ resistance to give an RC time constant of 0.25 s, which allows for about 2 Hz operation. A storage capacitor 110 stores 20 $\mu$F of charge until it is released through the silicon controlled rectifier (SCR) therein. The main trigger board and master timing pulse generator 114 comprise a monostable timer circuit that produces the proper trigger pulse to capacitor discharge circuit 110 when two conditions are met. These conditions are that a trigger signal is received through a delay generator 116 from master timing pulse generator 114 and that discharge capacitor 110 is fully charged. A capacitor discharge circuit channels the charge from the storage capacitor to the electrodes inside the vacuum chamber when it is triggered. This is achieved by sending the trigger signal from the main trigger board through a high voltage transistor optocoupler/isolator that electrically isolates the main trigger board from the capacitor discharge circuit that floats at a 1000 V potential when fully charged. This signal is used as the gate signal to trigger the SCR, which is connected in series between the cathode of the discharge capacitor and the anode of the vacuum spark gap. A discharge resistor/inductor limits the peak current from the capacitor discharge, temporally stretches the pulse width, and helps smooth any current spikes. The resistor/inductor is an approximately 30 cm long length of nickel-chromium wire wound into a 25 mm diameter coil of ten wraps. The resistance is one ohm and the inductance less than 1 $\mu$H. The actual discharge time, as measured by an oscilloscope, was found to be, about 10 $\mu$s. The anode and cathode units were also included in the description of the mechanical system, since they contain elements of both systems. These units bring the charge safely into the discharge region of the source.

The master timing pulse generator 114 synchronizes the data collection, pulsed valve trigger, and arc triggering. Pulse generator 114 is used as a master timing pulse generator to supply 1–2 Hz 15 V pulses directly to the pulsed valve driver 106 and 5 V pulses to the delay generator 116. The pulsed valve driver 106 conditions the 15 V signal to give a 120 V signal to the pulsed valve 104, (General Valve Series 9). The signal from delay generator 116 is sent to the main trigger board circuit of the PAMBD electronics that then triggers the SCR that discharges the storage capacitor. The discharge is monitored at the electrode leads across a sampling resistor. The deposition process can be monitored by an oscilloscope 118, a monochrometer/photomultiplier 120, a gated pulse generator 122, a signal detector 124, and by looking through windows 78 and 80 of FIG. 1.

Vacuum chamber 81 of FIG. 1 is evacuated by an oil diffusion pump (not shown) with a liquid nitrogen trap (not shown). The ultimate background pressure of vacuum chamber 81 is $1\times10^{-6}$ mbar. The pressure in the chamber is typically set at a peak pressure of $1\times10^{-4}$ mbar during the film deposition. The pressure is set by controlling the amount of gas pulsed into the vacuum chamber. The flux on the oxygen beam can be estimated at $8\times10^{17}$ molecules per pulse.

A nude ion gauge monitors the vacuum chamber pressure. The average pressure inside the PAMBD zone or region during typical operating conditions was estimated to be on the order of $1\times10^{-4}$ mbar. The peak maximum and minimum pressures inside the zone or region during 2 Hz operation probably differ by three or four orders of magnitude.

It is to be born in mind that the gas and arc pulse duration are variable over wide ranges. By way of example, the arc pulse duration can range from $10^{-9}$ to $10^{-2}$ seconds and the gas pulse duration can range from $10^{-4}$ to $10^{-2}$ seconds. The only limits on the deposition pulse rate are the vacuum pump and the design of the electronic discharge system. There is no inherent limit on the deposition rate.

The following examples present certain experiments that were conducted by the applicants. Results from production of titanium, cerium, and tin oxide films are presented in the following sections. Carbon, copper, copper oxide, and lead oxide films were also deposited with the PAMBD system.

For the titanium dioxide films, two pure titanium tubes (Goodfellow, 6.35 mm outside diameter, 0.89 mm wall, 99.6%) were used for electrodes. The cathode was ablated by 2 Hz 1400 A pulses with an approximate 10 $\mu$s dc arc discharge. The electrodes are ablated at a net rate of about 0.7 mg/h (0.7 mg/7200 pulses). In a typical experiment, the cathode loses about four times as much mass as the anode gains. The mass of the anode is increased due to material being sputtered directly from the cathode to the anode. Pure oxygen (reservoir pressure 15 psig, Irish Welding Supply) is pulsed between the electrodes. The gas pulse is synchronized with the dc discharge. A 1 ms delay between the start of the 2 ms $O_2$ pulse and start of the arc discharge was used. A glass microscope slide is positioned several centimeters from the source nozzle. This slide is held at room temperature and is used as the film substrate.

The emission spectrum of the Ti/$O_2$ plasma in the PAMBD zone or region was collected and analyzed. The emission spectrum is nearly identical to the emission spectrum observed using a (LAMBD) system to deposit titanium oxide films. A simulated spectrum was previously generated and matched to the LAMBD experimental spectrum using a model incorporating over 500 catalogued Ti and $Ti^+$ emission lines and temperature and fractional ionization parameters. Values for the LAMBD plasma temperature and fractional ionization were estimated to be about 15,000K and 0.5 fractional ionization. Since the PAMBD Ti spectrum closely matches the LAMBD Ti emission spectrum, nearly the same conditions are expected to exist in both systems.

Figure 3:
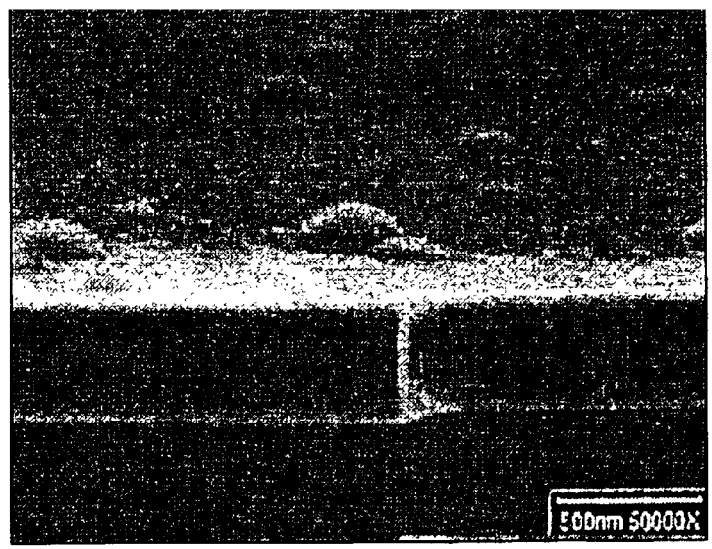
FIG. 3 is a scanning electron microscope (SEM) image of a titanium oxide film deposited using the PAMBD system.
Figure 4:
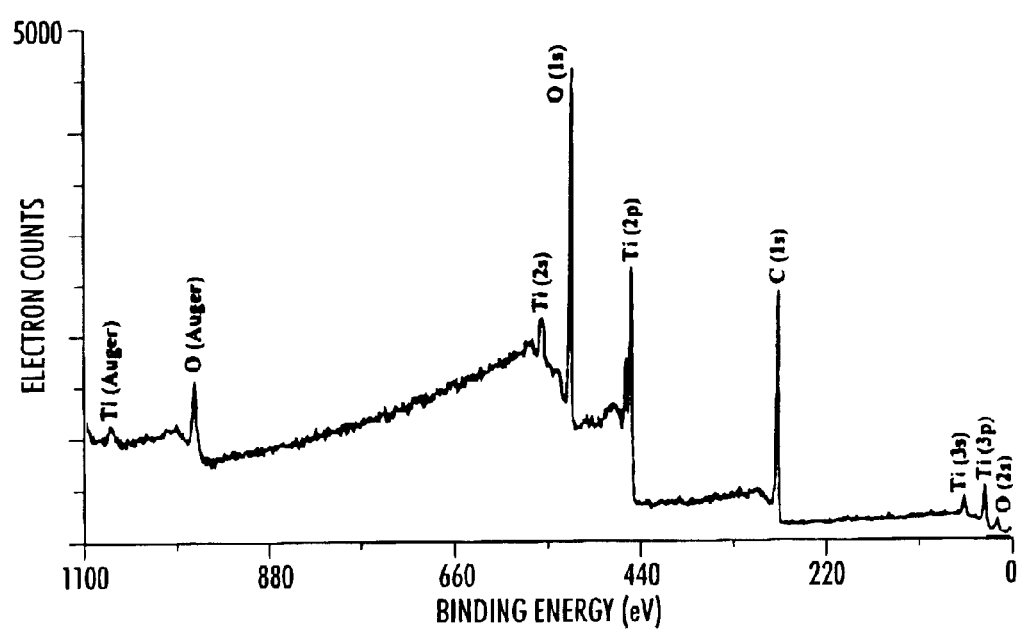
FIG. 4 is the spectrum of an electron spectroscopy for chemical analysis (ESCA) analysis of a titanium oxide film deposited using the PAMBD system.

FIG. 3 is a scanning electron microscopy (SEM) image of a titanium oxide film deposited using the PAMBD deposition system. When taken out of the deposition chamber, the titanium oxide thin film appeared light gray and slightly yellow with two interference fringes visible indicating a thickness of about ½ $\mu$m. This film was deposited with about 30000 discharge pulses to a final thickness of 400 nm and total area of about 5 $cm^2$. The glass substrate was positioned about 3.5 cm from the source nozzle. Several droplet imperfections appear on the approximately 1 $\mu$m surface shown in the image, and all have apparent diameters of less than 100 nm.

The titanium oxide films were characterized by electron spectroscopy for chemical analysis (ESCA). Only titanium, oxygen, and carbon appear in the low-resolution survey scan of the PAMBD titanium oxide film, shown in FIG. 4. The carbon impurity is present to some extent in almost all ESCA spectra unless special precautions are taken to exclude it. Such impurity may be present from aspirated pump oil, which could be eliminated using turbo- or cryo-pumps. The carbon comes from oil vapor in the vacuum chamber and from the air during film storage and transportation to the ESCA instrument. The 285 eV C (1 s) peak is usually used as an internal reference in the ESCA spectrum.

From the high resolution ESCA spectra of individual peaks, the charge corrected binding energy of the O (1 s) photoelectron peak, near 530 eV corresponds to the $O^{2-}$ anion in metal oxides and a smaller 532 eV peak corresponds to surface hydroxyl groups. The binding energies and spin orbit splitting of the Ti $(2p_{1/2})$ and Ti $(2\ p_{3/2})$, located at charge corrected binding energies 464.86 and 459.10 respectively, agree with reported values for $TiO_2$. There is no evidence in the high resolution ESCA spectrum of the Ti (2 p) binding energy peaks of unreacted Ti in the films.

An ESCA elemental profile through the depth of the film shown in the SEM image in FIG. 3 was collected. The O to Ti atom percent appears to be a consistent two to one throughout the depth of the film, in agreement with $TiO_2$ stoichiometry.

In another experiment, two pure cerium rods (Goodfellow, 6.35 mm diameter, 99.9% pure) were ablated in the same manner as the titanium tubes. The electrodes are ablated at a net rate of about 4 mg/h (4 mg/7200 pulses). Pure oxygen (15 psig, Irish Welding Supply) is pulsed between the electrodes. A glass microscope slide or a piece of a Si(111) wafer positioned several centimeters from the source nozzle and held at room temperature is used as a film substrate.

Figure 5:
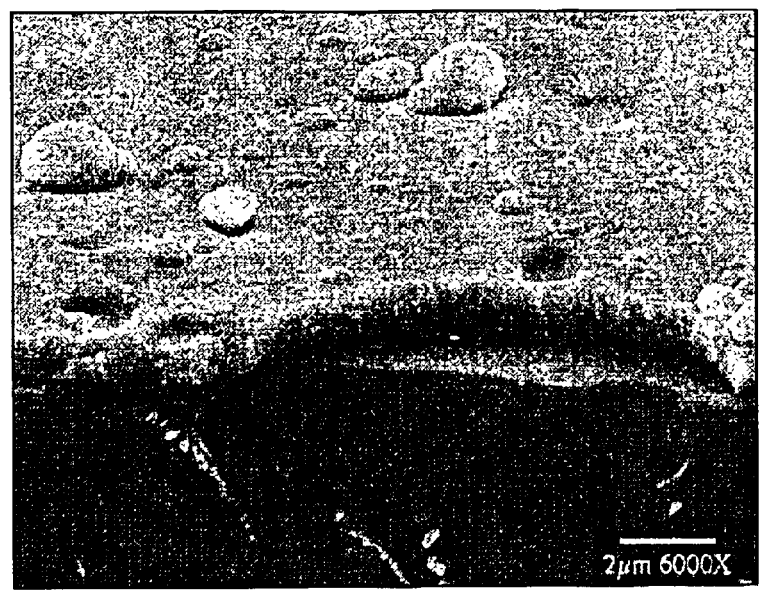
FIG. 5 is a scanning electron microscope (SEM) image of a cerium oxide film deposited using the PAMBD system.

When taken out of the deposition chamber, the cerium oxide thin films appear to have a bright mirror like reflectance with brightly colored interference fringes visible. FIG. 5 is a SEM image of a cerium oxide film deposited on a glass substrate. The film had two interference fringes, which indicates a thickness of about ½ μm. The thickness of the film observed in the SEM image agrees with the estimate. The film in FIG. 5 appears to be smooth with droplets up to 2 μm in diameter and some debris on the surface. The debris may be due to the oxide layer on the cerium electrodes being shattered and ejected during the arcing process. Cerium is a very reactive metal: The cerium rod used for the experiments would oxidize to a green color ($Ce_2O_3$) immediately after scraping a clean metal surface on the rod. After an experiment the electrodes would have a thick oxide layer visible on them that could be easily dislodged mechanically.

Figure 6:
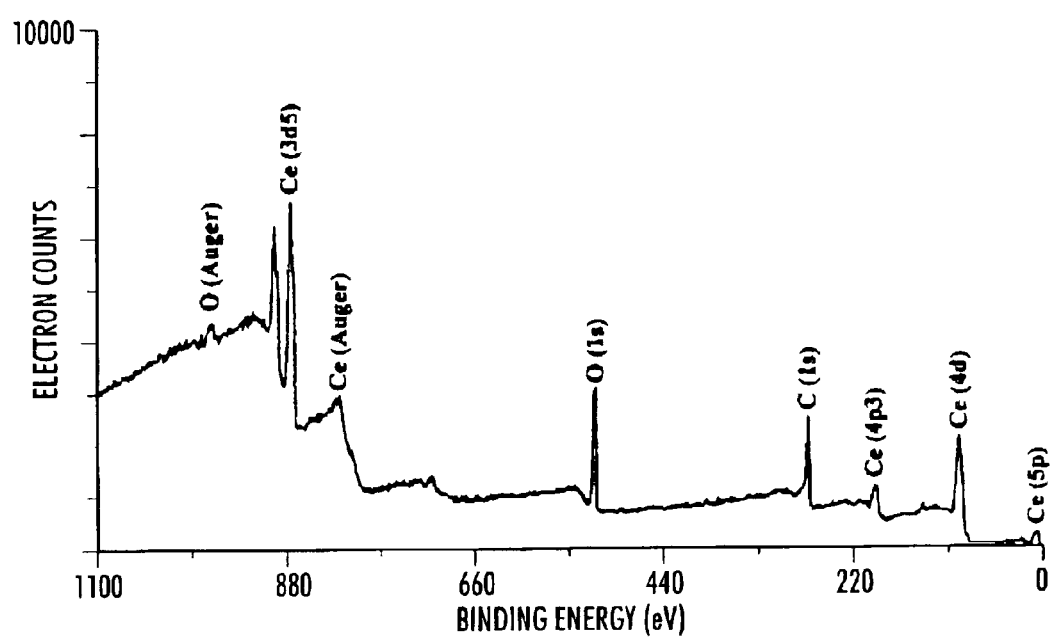
FIG. 6 is the spectrum of an electron spectroscopy for chemical analysis (ESCA) analysis of a cerium oxide film deposited using the PAMBD system.

Cerium oxide films characterized by ESCA showed no contaminants except for carbon. A low-resolution spectrum is shown in FIG. 6.

In yet another experiment, two pure tin rods (Goodfellow, 6.35 mm diameter, 99.99% pure) were ablated in the same manner as the Ti tube. The electrodes are ablated at a net rate of about 2.3 mg/h (2.3 mg/7200 pulses). Pure oxygen (Irish Welding Supply) is pulsed between the electrodes. A glass microscope slide positioned several centimeters from the source nozzle and held at room temperature is used as a film substrate.

Figure 7:
FIG. 7 is a scanning electron microscope (SEM) image of a tin oxide film deposited using the PAMBD system.

When taken out of the deposition chamber, the tin oxide thin films appear hazy gray brown and have colored interference fringes. FIG. 7 is a SEM image of a tin oxide film deposited on a glass substrate. The film had one interference fringe, which indicates a thickness of about ¼ μm. The film thickness observed in the SEM image agrees with the estimate. In the SEM image, the film appears to be smooth with a high density of droplets ranging in size from hundreds of nanometers up to 2 μm. The droplets are due to the arc melting the tin electrodes and liquid tin droplets being ejected from the electrodes during the deposition process. Tin is the lowest melting temperature (232° C.) material attempted to be deposited in the PAMBD zone or region and it has the most droplet deposition of any system studied so far.

Figure 8:
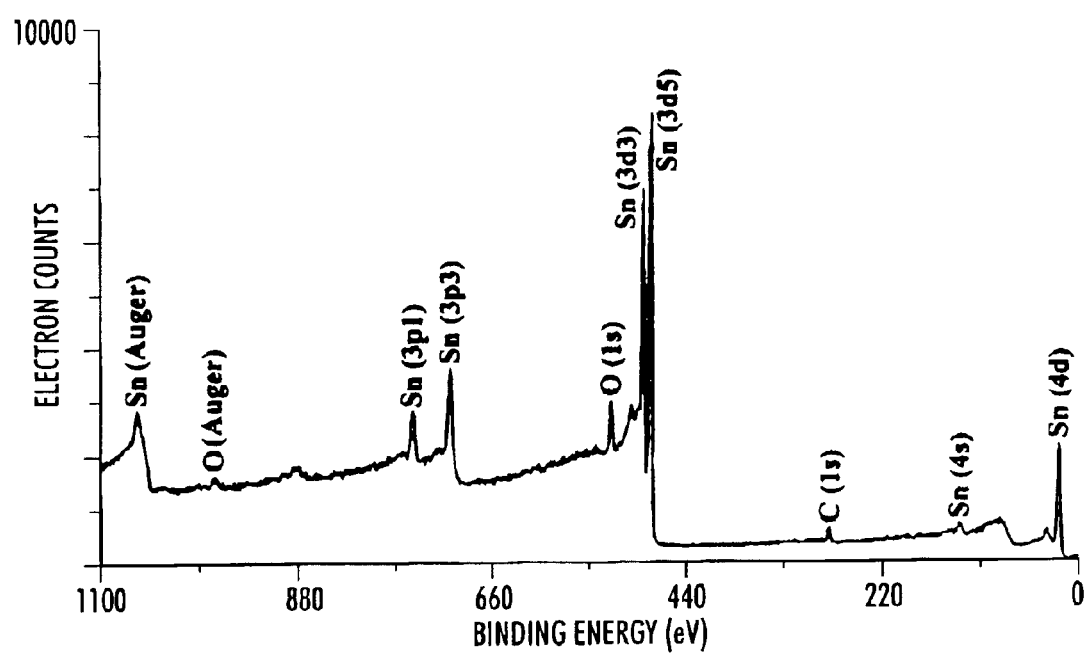
FIG. 8 is the spectrum of an electron spectroscopy for chemical analysis (ESCA) analysis of a tin oxide film deposited using the PAMBD system.

The low resolution ESCA spectrum of a tin oxide film, FIG. 8, shows no contaminants except carbon. The oxidation states of the tin could not be determined by ESCA because the Sn (3 d) electron binding energies of the $SnO_2$ and SnO species are too close to differentiate in the spectra taken, but the films are probably a mixture of both oxidation states.

Titanium, cerium, and tin oxide thin films were deposited using the PAMBD technique. The films were analyzed by SEM and ESCA for their physical and chemical properties. The titanium films were found to be relatively smooth and with few surface imperfections. The cerium films had slightly more droplet formation; some films had debris. The debris is possibly from fracturing the film and substrate for SEM analysis, or from the thick oxide layer, which readily forms on the highly reactive Ce metal rod being ejected during the arcing process. The tin system, a relatively low melting temperature material, showed extensive droplet deposition on the substrate surface, probably due to heating and melting of the electrodes in the arc and ejection of liquid droplets during the deposition experiment. Film quality appears to be affected by the starting material melting temperature: Ti 1660° C., Ce 798° C., and Sn 232° C., with the higher melting temperature metals giving better surface morphologies. There are no chemical impurities seen in the low resolution ESCA spectra except for the expected adventitious carbon.

The gas used in the PAMBD process can be either chemically inert (such as helium, neon, argon or other noble gases), to produce pure cathode material films, or chemically reactive (oxygen, nitrogen, as well as gases that form carbide, halide, sulfide and fluoride compounds to produce chemical compounds of the cathode material. Therefore, in addition to the metal oxide films described above, the PAMBD process can also be used to produce metal, metal nitride, metal oxide, metal carbide, metal halide, amorphous carbon and carbon allotropes (including fullerenes such as C60 and C70), carbon-containing, silicon-containing and metal/carbon, metal/silicon, silicon/carbon composite films. Non limiting examples of such compounds include halides formed from halogen gas (i.e., $F_2$, $Cl_2$, $Br_2$, $I_2$); sulfides formed from $H_2S$ or $SO_2$ gases; carbides formed from $CO_2$, CO, alkanes or alkenes and nitrides formed from $N_2$ or $NH_3$, or any of these reactive gases diluted in any of the previous unreactive gases. In general, the PAMBD process can be used to deposit films of any composition containing a metallic element, carbon or silicon. Nanopowders may also be produced by this process.

With only slight alterations, such as by replacing the flat substrate with a collection basket to collect particles or by using an extended nozzle and a particle collection apparatus such as a cold finger in place of the substrate, the PAMBD apparatus can be used to produce nanopowders or ultra fine powders. Nanopowders are composed of nanoparticles of sizes ranging between 3 and 100 μm. Nanopowder applications include high surface area supports for catalysts, heat sinks, tribological and thermal barrier coatings, optoelectronics and photovoltaics, capacitors, batteries, polishing compounds and magnetic recording heads. High purity nanopowders of carbides and nitrides in particular are not presently commercially available. The simple, inexpensive, PAMBP technique will be useful for many materials. Nanopowders of metal, metal nitride, metal oxide, metal carbide, metal halide, carbon, metallo-carbohederenes and other metal/carbon composites are good candidates for synthesis by PAMBP.

Figure 9:
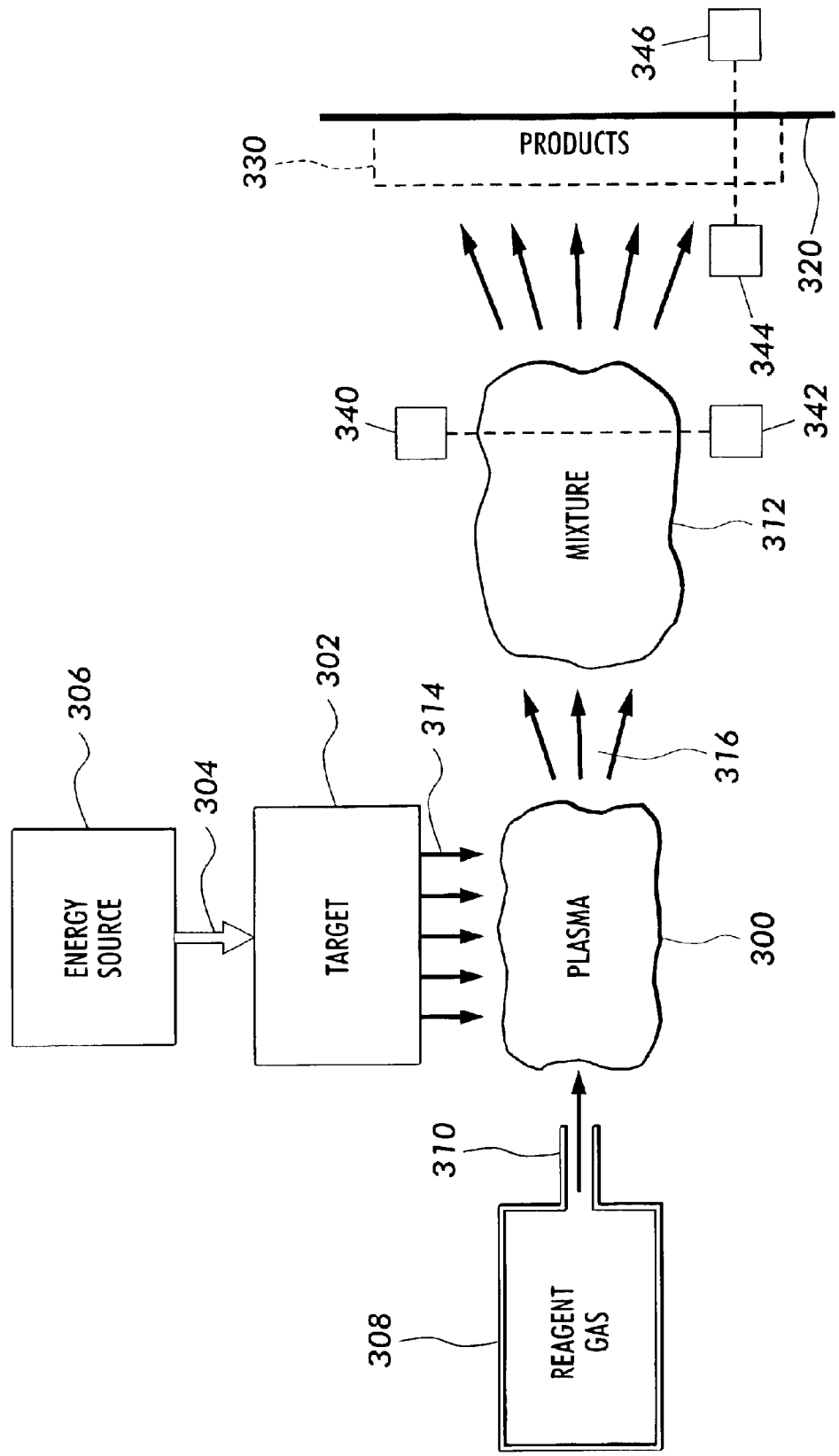
FIG. 9 is a schematic representation of a general process of this invention in which chemically reactive plasma is produced.

FIG. 9 is a schematic representation of processes of this invention in which plasma 300 is produced. The plasma 300 produced by the processes of this invention preferably has certain properties. The plasma 300 is generally at a temperature of 2,000 to about 21,000 degrees Celsius. In one embodiment, the plasma 300 is at a temperature of from about 10,000 to about 20,000 degrees Celsius. In another embodiment, the plasma 300 is at a temperature of from about 3,000 to about 10,000 degrees Celsius.

Referring again to FIG. 9, plasma 300 is produced by the application of energy 304 from energy source 306 upon target 302. It is to be understood that numerous devices are suitable as energy source 306. In one preferred embodiment, a high voltage power supply is used as energy source 306, and target 302 comprises a pair of electrodes, which are electrically connected to said power supply. The high voltage power supply is preferably operated in a pulsed mode, resulting in pulsed arcing between the electrodes, which produces plasma 300. It is also to be understood that in some embodiments, at least a first plasma and a second plasma are generated, and are mixed with each other and/or with reagent gas to produce multi-component substances.

In one embodiment, a laser beam is directed upon target 302 to perform laser assisted molecular beam deposition (LAMBD), or an electron beam directed at target 302 to perform electron beam assisted molecular beam deposition (EAMBD), to achieve substantially the same result. In general, it is preferred that the energy 304 from energy source 306 be applied to a small area of target 302, with the operative requirement being that energy source 306 provides energy 304 upon a surface of target 302 at an energy density of between 1 and 1000 joules/cm$^2$. Such an energy density will ensure that plasma 300 is produced.

It is to be understood that target 302 may comprise a variety of material compositions, and may comprise a single object, or a plurality of objects. In embodiments, target 302 comprises a single object further comprising a single homogeneous substance, or an alloy, or a composite, or a first substance reinforced by a second substance, or the like. Alternatively, target 302 comprises a plurality of objects, comprising various combinations of substances as described above for a target comprising a single object. In one embodiment, target 302 comprises a first electrode comprising a first substance, and a second electrode comprising a second substance, each electrode being electrically connected to an energy source comprising a high voltage power supply.

Referring again to FIG. 9, in the present invention, reagent gas 308 is delivered through conduit 310, such that reagent gas 308 mixes with plasma 300. The delivery of reagent gas 308 serves one or all of several functions, depending upon what the desired end products 330 are to be obtained from the process. In one embodiment, reagent gas 308 transports the plasma 300 toward harvesting device 320. In another embodiment, reagent gas 308 is also a reactant material, wherein reagent gas reacts with plasma 300, and/or with ablated target material indicated by arrows 314, and produces products 330, which are derivatives of reagent gas 308. In a third embodiment, reagent gas 308 becomes ionized, and becomes a component of plasma 300. In a fourth embodiment, reagent gas 308 quenches reactions occurring in plasma 300, and mixture 312. In a fifth embodiment, reagent gas 308 cools plasma 300, and/or mixture 312. In a sixth embodiment, reagent gas 308 catalyzes reactions in plasma 300, and/or mixture 312.

Accordingly, reagent gas 308 may comprise a variety of gases in various proportions, and reagent gas may be delivered from a single source, or a plurality of sources. In one embodiment, reagent gas 308 comprises a single inert gas, e.g. one of the noble gases. In another embodiment, reagent gas comprises a mixture of an inert gas and a reactive gas, which reacts with plasma 300. Such reactive gas may include, but is not limited to, steam, nitrogen, oxidant gases (e.g. $O_2$ and $O_3$), halogen gases (e.g. $I_2$, $Br_2$, $Cl_2$ and $F_2$), flammable gases (e.g. $CH_4$, $C_2H_6$, $C_3H_8$, $C_2H_2$), acid gases (e.g. HCl), basic gases (e.g. $NH_3$), hydride gases (e.g. $H_2$, $PH_5$, $SiH_4$, $AsH_3$), metalo-organic gases, (e.g. $(CH_4)_4Ga$), metal carbonyl gases (e.g. $Ni(CO)_5$, $Fe(CO)_5$, $Co(CO)_5$), and the like. In embodiments where the gases are reactive with each other, such as with $O_2$ and $CH_4$ for example, such gases are delivered to the plasma 300 from separate sources. The term reagent gas as used herein is therefore understood to encompass all of these embodiments.

As is indicated in FIG. 9, the plasma 300 depicted is comprised of ablated material 314 (indicated by arrows) from target 302, reagent gas 308 introduced into the plasma via conduit 310, and various ionized species thereof. Through the convective action of the directional flow of reagent gas 308 out of conduit 310, plasma 300 is transported away from the source of reagent gas 308 as mixture 312. Mixture 312 is generally at a substantially lower temperature than plasma 300. In one embodiment, mixture 312 is on the order of room temperature, i.e. between 10 and 30 degrees Celsius.

Mixture 312 is comprised of unreacted reagent gas and the product(s) produced from the ablated material 314 from target 302. Such product(s) may be produced by interaction(s) with reagent gas 308 and/or interactions of multiple target materials with each other, or interactions of multiple gaseous components of reagent gas 308 with each other.

At the initial point that the reagent gas 308 contacts the ablated material 314 from target 302, the gaseous mixture thus formed generally is a dilute mixture of unreacted reagent gas 308 and on the order of a few parts per million of the ablated target material 302. Thereafter, the reagent gas 308 and the ablated target material 314 react within plasma region 300, and then cool, while flowing toward harvesting device 320.

The reagent gas 308, which is used to interact with the ablated particles 314 generally has a pressure within conduit 310 of from about 1 to about 10 atmospheres, at the outlet of conduit 310. In one preferred process of the invention, the reagent gas 308 is caused to expand so that its volume increases from the outlet of conduit 310 to region 316.

Referring again to FIG. 9, products 330 may be either formed as a thin film or as a fine powder. The process of the present invention produces a thin film with a thickness between 0.1 and 100,000 nanometers. The process of the present invention produces fine powders in which the principal dimension (diameter, or shortest distance across a cross section) is on the order of nanometers. The process conditions that result in thin films or in nanopowders are described elsewhere in this specification. In embodiments where products 330 are to form a thin film, harvesting device 320 comprises a substrate (not shown) further comprising a surface. In like manner, in instances where products 330 are to form nanoparticles, harvesting device 320 comprises a screen (not shown) or other device (not shown) from which said nanoparticles are dislodged and transported to a receiving vessel (not shown).

Products 330 comprise materials derived from target 302. Such derivatives may be either the same material or materials of target 302, or, for example, alloys of materials of target 302, or different crystal forms of materials of target 302, or reaction products formed by the reaction of the ablated target materials comprising plasma 300, or reaction products formed by reaction between ablated target materials comprising plasma 300 and reagent gas 308. Such derivatives of target 302 may be harvested as either thin films or fine powders.

The composition, properties, or otherwise functional specification(s) of products 330 harvested as either thin films or as a fine powders may be measured and controlled by various instruments and controls known in the art. Referring again to FIG. 9, in one embodiment, a spectrophotometer comprising a light source 340 and a spectral detector 342 is used to monitor the properties of the gaseous mixture 312 or the plasma 300, which are the precursors to products 330. The spectrophotometer may be positioned at any suitable location along the process, at the inlet of reagent gas, in the area where plasma 300 is generated, in the area where mixture 312 is quenched, or immediately prior to harvesting device 320. In one embodiment, an infrared spectrophotometer is used to monitor the process of the present invention.

It will be apparent that while a spectrophotometer that functions in the light-transmissive mode has been described, other devices that rely on light reflection or light backscattering as a measurement principle may be suitable, depending on the particular properties of the process and materials to be monitored. In one embodiment wherein the composition of plasma 300 is measured, light source 340 is not present. Spectral detector 342 comprises an atomic and/or molecular emissions spectrometer known in the art, which analyzes the emissions spectrum emitted by plasma 300.

In further embodiments, the properties of products 330, which are harvested on harvesting device 320 are measured. In a first embodiment (not shown), the spectrophotometer previously described is positioned to measure the composition of products 330. In a second embodiment (not shown), an infrared pyrometer acquires thermal radiation from products 330, and calculates the temperature of products 330. In a third embodiment, a light source 344 directs light through products 330 and through a window (not shown) to a camera 346, which acquires images of products 330 during their harvesting. It will be apparent that in this embodiment, harvesting device 320 must be transparent. Alternatively, camera 346 is positioned adjacent to light source 344 on the same side of the surface of 320, and images of products 330 are acquired in the reflective mode, rather than the transmissive mode. In a one embodiment, camera 346 is a still frame camera. In another embodiment, camera 346 is a video camera. In yet another embodiment, camera 346 is a digital camera.

In each of these embodiments of the present invention, data acquired on the plasma, mixtures, and/or reaction products therein may be provided as input data to process controller 65 of FIGS. 1, 16, 18, or 19, which utilizes standard known process control, image analysis, and machine vision algorithms, and the like, to provide output control signals to the vacuum pump(s), pulsed valve(s), electrodes, laser(s), servos, and other components of the present invention, in order to produce the desired products 330 in a controlled manner.

Figure 10:
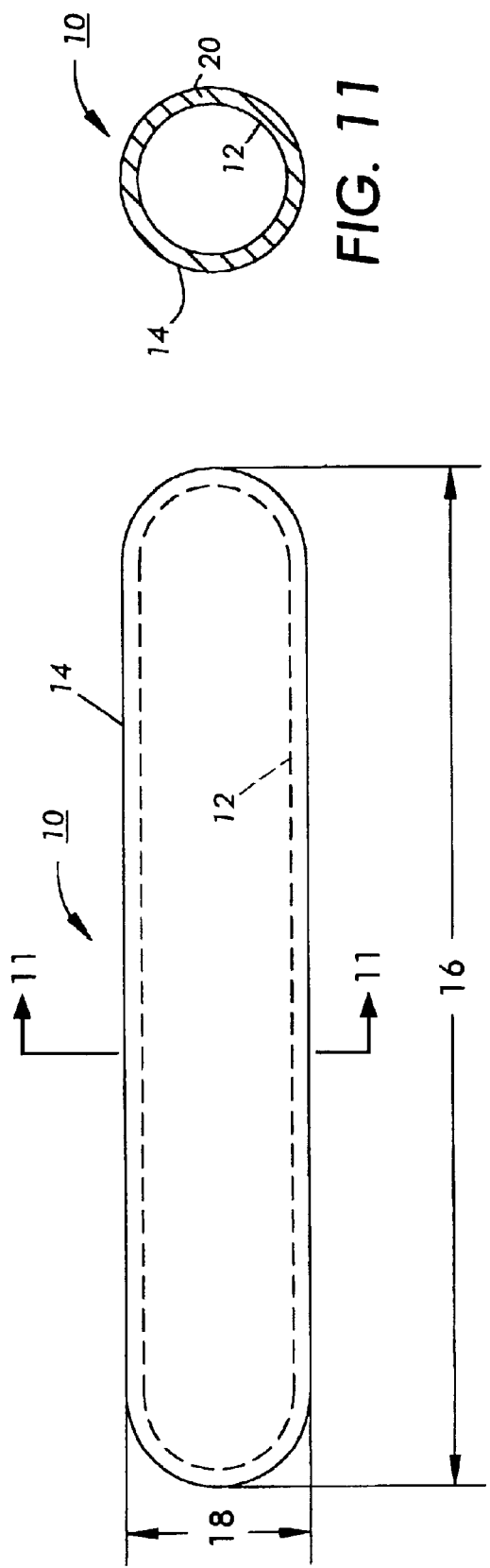
FIG. 10 is a side view of a single-walled carbon nanotube.

FIG. 10 is a schematic representation of a single-walled nanotube 10, which is not drawn to scale. These nanotubes, and their production, are well known in the art. Reference may be had, e.g., to U.S. Pat. No. 6,221,330, which describes a process for producing hollow, single-walled carbon nanotubes by the catalytic decomposition of one or more gaseous carbon compounds. The entire disclosure of this United States patent is hereby incorporated by reference into this specification.

Referring to FIG. 10, it will be seen that the nanotube 10 is comprised of single wall defined by interior surface 12 (shown in dotted line outline) and exterior surface 14.

Typically the nanotube 10 has a length 16 of at least about 0.1 microns and generally from 10 to about 200 microns. The diameter 18 of the nanotube is generally less than 1 micron and, preferably, less than about 0.1 micron. The aspect ratio of nanotube 10, the ratio of its length 16 to its diameter 18, is at least about 5, more preferably at least about 100, and even more preferably at least about 1,000.

The preferred nanotube 10 is preferably substantially, i.e., it contains at least about 99.9 percent fullerene and less than about 100 parts per million of contaminant. As used in this specification for this example only, the term contaminant refers to any material, which is not carbon. As will be apparent, the nanotube produced by the process of this invention is inherently more pure than the nanotubes produced by processes that utilize supported metal catalyst. As is disclosed in U.S. Pat. No. 6,221,330, the use of supported metal catalysis is inherently disadvantageous in that the supported catalyst is necessarily incorporated into the single-walled carbon nanotube formed therefrom. The entire disclosure of this United States patent is hereby incorporated by reference into this specification.

Figure 11:
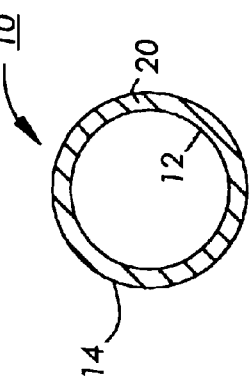
FIG. 11 is a sectional view of a single-walled carbon nanotube.

The process described in U.S. Pat. No. 6,221,330 does not incorporate a substantial amount of metal catalyst into its final product. However, the product produced by such process contains a substantial amount of multi-walled carbon nanotube product. FIG. 11 is a sectional view of the nanotube 10, taken along line 11—11 of FIG. 10, illustrating that only one wall 20 is formed by the process of this invention. By comparison, FIG. 12 is a sectional view of a multi-walled nanotube 22.

Figure 12:
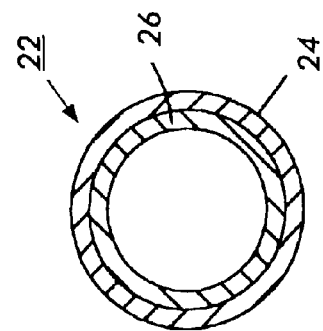
FIG. 12 is a sectional view of a multi-walled carbon nanotube.

Referring to FIG. 12, a multi-walled nanotube 22 is depicted with two walls 24 and 26. As will be apparent to those skilled in the art, many more such concentric walls are often present in the multi-walled nanotube, often up to about 20 or more of such concentric walls.

The multi-walled nanotube 22 typically contains a multiplicity of walls with different physical, structural, and chemical properties, each of which also may have indeterminate structure and length. The properties of the composite multi-walled structure vary substantially from one nanotube to the other and, thus, these multi-walled nanotubes cannot be used with any degree of predictability in processes requiring finite, reproducible properties.

FIG. 1 is a schematic of one preferred process 30 of the invention. In this process, an area 32 of high temperature is caused to exist between electrodes 34 and 36.

It is preferred that area 32 preferably have a temperature in excess of 1,000 degrees Celsius, and preferably in excess of 5,000 degrees Celsius. In one embodiment, the temperature in area 32 is in excess of 10,000 degrees Celsius.

As is known to those skilled in the art, and as is used in this specification, fullerenes are any of several forms of carbon consisting of atoms joined together as a hollow structure. They are single molecules of carbon containing (30+2n) carbon atoms, wherein n is a positive integer, preferably from about 1 to about 1000. In one embodiment, the fullerene molecules contain 60 carbon atoms.

These fullerenes, and their preparation, are well known to those skilled in the art. Reference may be had, e.g., to U.S. Pat. Nos. 5,876,684, 5,575,615, 5,561,102, 5,530,203, 5,275,705, and the like. The entire disclosures of these United States patents are hereby incorporated by reference into this specification.

Referring again to FIG. 1, the plasma within area 32 is at least about 10 volume percent of ions and, more preferably, at least about 40 volume percent of ions. In one embodiment, the plasma contains at least about 50 volume percent of ions.

Referring again to FIG. 1, the electrodes 34 and 36 preferably consist essentially of compressed fullerene material. As used herein for this example, the term "consist essentially" means that at least about 99.9 percent of such electrodes are fullerene.

In another embodiment, not shown, the electrodes 34 and 36 comprise a major amount of carbon-containing material, such as graphite.

In another embodiment, not shown, the electrodes 34 and 36 contain a mixture of fullerene material and metal. A typical electrode 34 that can be used in this manner is illustrated in FIG. 13A.

Figure 13B:
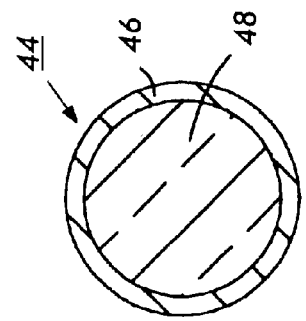
FIG. 13B is a cross-sectional view of one embodiment of an electrode used in the present invention, comprising a carbon core and a metal sheath.
Figure 13A:
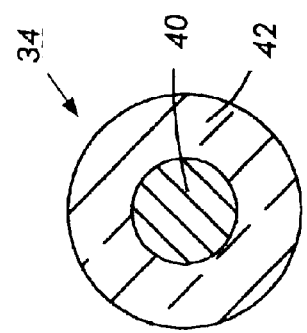
FIG. 13A is a cross-sectional view of one embodiment of an electrode used in the present invention, comprising a metal core and a carbon sheath.

Referring to FIG. 13A, and in the preferred embodiment depicted therein, the electrode 34 depicted is comprised of a core 40 of metal surrounded by a sheath 42 of compressed carbon and/or fullerene material. This electrode 34 may be made by preparing a carbon tube and filling it with molten metal, such as nickel, iron, cobalt, molybdenum and the like.

FIG. 13B is sectional view of an electrode 44 in which the metal sheath 46 encompasses a carbon and/or fullerene core 48.

In one embodiment, not shown, the electrode 34 is a sintered aggregate of carbon/fullerene metal mixed with one or more of the aforementioned metals and thereafter heated to form a homogeneous sintered mass.

Referring again to FIG. 1, and in the preferred embodiment depicted, each of the electrodes 34 and 36 are preferably cylindrically shaped, have a length of from about 8 to 16 inches, and have a diameter of from about 0.1 to about 0.5 inches.

The electrodes 34 and 36 are comprised of ends 50 and 52, which define a gap 54 therebetween. The gap 54 is preferably from about 0.5 to about 5 millimeters, and more preferably, from about 1 to about 4 millimeters.

During the process 30, it is preferred to maintain gap 54 so that it is substantially constant. This is difficult in that, during such process, the electrodes 34 and 36 are consumed and, thus, their dimensions are changed. In order to maintain a uniform gap, means are provided for moving the electrodes 34 and/or 36 in the direction of arrows 56, 58, 60, and 62.

In the embodiment depicted in FIG. 1, controller 65 is operatively connected to sensors 64 and 66, which are adapted to measure the respective impedances of the electrodes 34 and 36. As will be apparent to those skilled in the art, the impedance of each of electrodes 34 and 36 will change when their lengths, and other factors, change. By the use of a programmable computer (not shown) in controller 65, the effect of the change in impedance of any particular electrode 34/36 and its corresponding causative change in length of said electrode is determined. After such determination, controller 65 causes servo drives 68 and 70 to make appropriate adjustments in the gap 54.

The controller 65 is also operatively connected to the gas supply 72 and, thus, can vary the rate of gas flow therefrom, and/or the pressure of the gas pulses therefrom. The properties of the plasma pulses produced in the process can be measured by sensor 74, which may, e.g., be a fast ion gauge. Sensor 74 feeds information back to controller 65 which, depending upon the information received, can vary the pulse rate, the gas pressure, and other parameters.

Referring again to FIG. 1, and in the embodiment depicted, gas flows from the gas supply 72 in the directions of arrows 73 and 75, past the area 32 between the electrodes 34 and 36, and into the quench area 77. The gas flow rate is so regulated that the heated plasma within the electrode area 32 is cooled within a period of less than 2 milliseconds from its temperature in excess of 1,000 degrees Celsius to a temperature of less than 500 degrees Celsius. In one embodiment, the heated plasma is cooled from a temperature of at least about 5,000 degrees Celsius to a temperature of less than 500 degrees Celsius in less than about 1 millisecond.

In the embodiment depicted in FIG. 1, the quench area 77 is at room temperature. In one aspect of this embodiment, the whole process is conducted within a vacuum chamber 79 depicted by double dotted line outline in FIG. 1. The controller 65 and/or the servo drives 68 and 70 may be disposed within such vacuum chamber 79, but they may also be disposed outside of such chamber 79.

In the embodiment depicted in FIG. 1, two vacuum chambers are depicted. The vacuum chamber 79 is indicated by double dotted lines; and it houses the arc discharge apparatus. The vacuum chamber 81 is indicated by solid double lines, and it houses the harvester/sensor device described elsewhere in this specification. In the embodiment depicted, the two vacuum chambers 79 and 81 are separated by an orifice 83. In another embodiment, not shown, the two chambers 79 and 81 communicate with each other and form one continuous chamber, wherein the coating of a film or the harvesting of particles is performed therein.

In either event, it is preferred to maintain a vacuum of less than about 1 Torr within chambers 79 and 81 prior to the time the reaction occurs. In one embodiment, the vacuum so maintained is less than about 0.1 Torr and, more preferably, less than about 0.01 Torr. In an even more preferred embodiment, the vacuum so maintained is less than about 0.001 Torr.

The heated plasma, at a temperature of at least about 1,000 degrees Celsius, then is quickly transformed to a state in which its temperature is less than 500 degrees Celsius and its pressure is less than about 1 Torr; typically this transformation occurs in a period of less than about 10 milliseconds.

In one preferred embodiment, the electrodes 34 and 36 are made from a pressed fullerene material. This pressed fullerene material typically has a density of from about 2 to about 4 grams per cubic centimeter and, more preferably, from about 2 to about 3 grams per cubic centimeter.

The pressed fullerene material preferably has a hardness of from about 1 to about 5 (Mohs scale). In one embodiment, the hardness of such pressed fullerene is from about 2 to about 3 (Mohs scale).

The pressed fullerene material has an electrical resistivity less than 0.1 ohm-centimeters and, preferably, less than about 0.01 ohms-centimeters.

The pressed fullerene material preferably has a compressive strength of from about 10 to about 100 MegaPascals.

In one embodiment, pressed fullerene material is made from commercially available soot. It is preferred that the soot used in the process preferably has at least about 98 weight percent of its particles smaller with a diameter in the range of from about 0.7 to about 1.0 nanometers and is comprised of at least about 99 weight percent of carbon. In one embodiment, the soot used preferably is comprised of at least 99 weight percent of fullerene material. To the extent that commercially available soot is not pure enough, it may be purified prior to the time it is agglomerated and hot-pressed.

Soot that contains at least 99 weight percent of fullerene material and has at least 98 percent of its particles smaller than about 1.0 nanometer is available. Reference may be had, e.g., to U.S. Pat. Nos. 5,750,615, 5,558,903, 5,876,684, 6,171,451, 5,660,397, 5,462,680, and the like; the entire disclosure of each of these United States patents is hereby incorporated by reference into this specification.

The properties of fullerene soot have been explored by, e.g., the SRI International Company of 333 Ravenswood Avenue, Menlo Park, Calif.

The starting soot material is then preferably agglomerated prior to the time it is hot pressed to form the electrodes. It is preferred to agglomerate the fine soot particles so that the average particle size of the agglomerated soot is within the range of from about 1 to about 100 microns and, more preferably, from about 1 to about 10 microns. One may agglomerate the soot particles by conventional means.

The soot used in the process, which preferably is fullerene soot with the properties specified hereinabove, is preferably hot pressed in a sintering press at a temperature of from about 300 to about 1,000 degrees Celsius and pressure of from about 0.5 to 10 GigaPascals for a period of at least 1 second.

In one embodiment, prior to the time the soot is hot pressed into the desired electrode shape, it may be admixed from about 1 to about 10 weight percent (by total weight of catalyst and soot) of metal catalyst. Suitable metal catalysts include, e.g., nickel, cobalt, iron, and the like. These metal catalysts preferably have a particle size distribution such that at least about 90 weight percent of the catalyst particles have a diameter within the range of from about 0.7 to about 1.0 nanometers.

Referring again to FIG. 1, and in one preferred embodiment thereof, it is preferred that one generate a difference of potential of at least about 100 volts between the ends 50/52 of electrodes 34 and 36 sufficient to ionize the gas and cause dielectric breakdown thereof. In one embodiment, the difference of potential utilized is from about 1,000 to about 5,000 volts. As will be apparent to those skilled in the art, depending upon the gas composition and gas pressure used, different voltages will be required.

In one embodiment, the energy provided is in the form of pulsed direct current with a voltage of from about 100 to about 5,000 volts, and a pulse duration of from about 1 microsecond to about 50 microseconds. The period between adjacent pulses generally is from about 500 to about 2000 milliseconds. The sequence of pulses/resting periods/pulses is continued until the desired amount of material has been harvested.

Without wishing to be bound to any particular theory, applicants believe that the conditions utilized in their process produce gaseous fullerene ions in the area 32 between electrodes 34 and 36 and that these gaseous fullerene ions, in combination with other materials, facilitate the deposition of single-walled carbon nanotubes.

One may use conventional means for generating the desired differences of potential and coordinating such differences with the gas pulses produced. One preferred means for achieving such end is depicted in FIG. 2.

Figure 2:
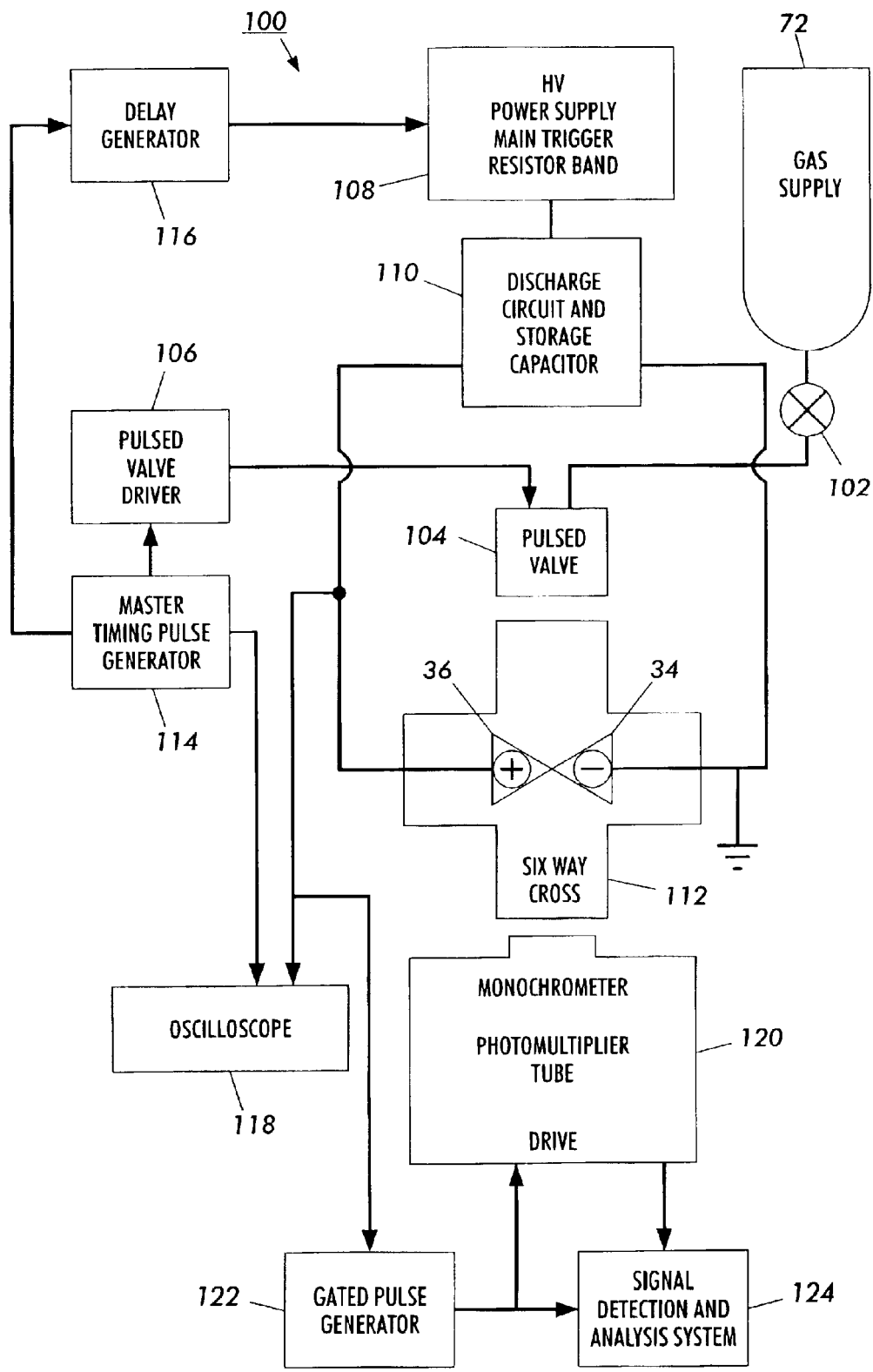
FIG. 2 is a block diagram of the control system of the deposition apparatus of the present invention.

Referring to FIG. 2, the assembly 100 depicted is comprised of gas supply 72 connected to valve 102 and thence to pulsed valve 104. The pulsed valve 104, in response to signals from pulsed valve driver 106, provides pulses of the desired gas to area 32 (see FIG. 1).

In one embodiment, illustrated in FIG. 2, the assembly 100 provides a clean vacuum environment for material deposition, shielding, and containment of electrical discharge. The system 100 is comprised of direct current power supply 108, an energy storage capacitor and discharge circuit 110, and other triggering, timing and safety components needed for operation.

The high voltage direct current power system 108 preferably converts 110 volt alternating current into 1200 volt direct current. A resistor bank is preferably used to limit the charging current of the circuit. The resistor bank preferably has 12,000 ohm resistance to give an RC time constant of 0.25 seconds, which allows for 2 hertz operation. A storage capacitor 110 stores 20.3 microfarads of charge until it is released through a silicon-controlled rectifier. The main trigger board is preferably a monostable timer circuit that produces the proper trigger pulse to the capacitor discharge circuit.

The gas used preferably is or comprises an inert gas, such as helium, argon, nitrogen, krypton, xenon, neon, and mixtures thereof. At least about 85 volume percent of the gas will be inert gas.

In one embodiment, the gas used contains both such inert gas and minor amounts of one or more hydrocarbon gases. One may use from about 1 to about 15 volume percent of such hydrocarbon gas(es) and, more preferably, from about 1 to about 10 volume percent of such hydrocarbon gas(es). Suitable hydrocarbon gases include, e.g., methane, ethane, propane, butane, ethylene, acetylene, propylene, and other unsaturated, gaseous hydrocarbons. In general, it is preferred that such gaseous materials contain less than about 5 carbon atoms per molecule.

In another embodiment, one may use from about 10 to about 70 volume percent of such hydrocarbon gas(es) and, more preferably, from about 15 to about 50 volume percent of such hydrocarbon gas(es).

In one embodiment, in addition to the inert gas(es) and the hydrocarbon gas(es), one may admix from about 0.1 to about 5.0 volume percent of gaseous metal compounds. Suitable catalytic gaseous components include gases of the formula $M(CO)_n$, wherein M is a metal selected from the group consisting of nickel, cobalt, iron, and mixtures thereof, and n is an integer from 1 to at least 5, dependent upon the particular metal.

Referring again to FIG. 1, and in the preferred embodiment depicted therein, the quenched plasma is preferably harvested on a substrate 87. The substrate 87 may be stationary, it may be movable, it may be water cooled, etc.

In one preferred embodiment, the substrate 87 is a material, which will facilitate the deposition of single-walled nanotubes. Such materials include, e.g., a water-cooled copper block, a titanium film, an aluminum material, etc.

Figure 14:
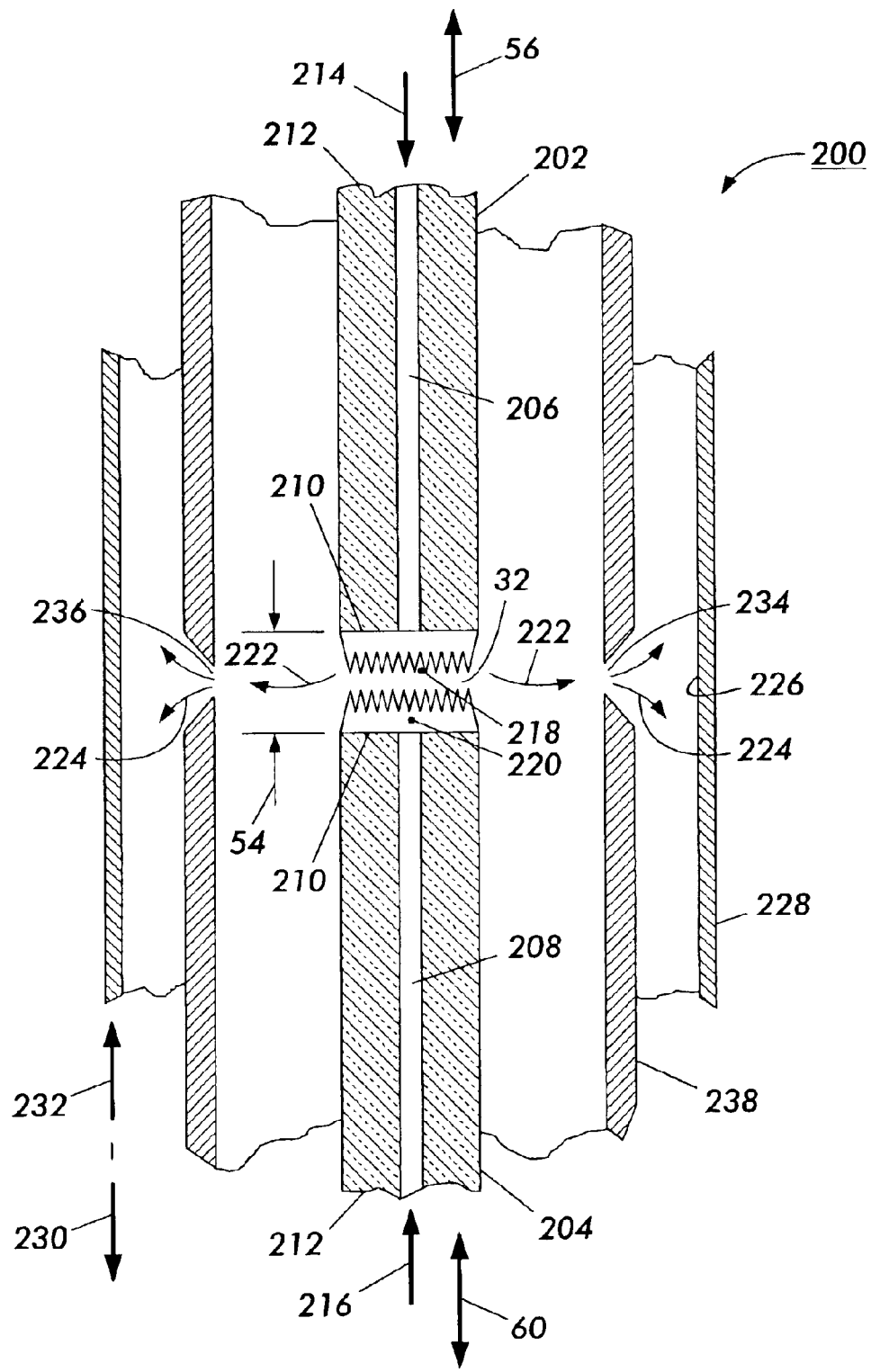
FIG. 14 is a schematic representation of a process for synthesizing materials, which utilizes two electrodes, electrodes, each comprising an orifice.

FIG. 14 is a schematic representation of a process 200, which utilizes two electrodes, electrodes 202 and 204. These electrodes 202 and 204 are each comprised of an orifice 206 and 208, respectively, extending from their proximal ends 210 to their distal ends 212. In the manner depicted in FIG. 1, or by a similar manner, the gap 54 between electrodes 202 and 204 can be maintained at a substantially constant and optimal distance. Referring again to FIG. 14, input gases are fed to the orifices 206/208 in the direction of arrows 214/216. In one embodiment, it is preferred that the input gas fed to orifice 206 differ from the input gas fed to orifice 208. In another embodiment, such gases are the same.

As will be apparent, when different gases are fed to orifices 206 and 208, different reactants will occur at points 218 and 220. These different moieties can then react with each other within the plasma to form otherwise unattainable compounds, alloys, admixtures, and the like.

In addition to utilizing different gas(es), one may utilize different material(s) for the electrodes 202 and 204 to provide for a large multiplicity of different reaction intermediates and products.

As will be apparent, different portions of the plasma of area 32 will have different concentrations of ions, elements, compounds, and the like. However by uniformly agitating and mixing the plasma of area 32, a substantially uniform material may be created.

One means of creating such a substantially uniform material is be controlling the outflow of plasma of area 32 in the directions of arrows 222 and 224, and coordinating such outflows with input flows 214 and 216, so that, because of the combinations of such flows and the various pressure differentials, substantially uniform mixing and turbulence is created. The means of creating such uniform mixing will be apparent to those in the fluid flow/plasma arts.

In one embodiment, the plasma is harvested on the inside surface 226 of the substrate sleeve 228. In one aspect of this embodiment, substrate sleeve 228 can be moved in the directions of arrows 230 and/or 232, it can be cooled and/or heated, and it can be modified in any manner adapted to facilitate the deposition and/or the adhesion and/or the conversion of the plasma of area 32.

As will be apparent to those skilled in the art, the relative sizes of pressure vessel 238 and/or substrate sleeve 228 and/or the inside surface 226 of substrate sleeve 228 may be chosen in a manner adapted to facilitate the gradual accumulation of a relatively large thickness of deposited material at specified points in time and/or space. These accumulated material(s) can be periodically removed by conventional means such as, e.g., trap doors, air lock assemblies, and the like, which will not require loss of evacuation within the system and/or termination of the process. Referring again to FIG. 14, the plasma is allowed to flow through orifices 234 and 236 prior to the time it contacts the substrate sleeve 228. In the embodiment depicted, only one such orifice is shown per side of the plasma chamber. In another embodiment, a multiplicity of such orifices is utilized. In yet another embodiment, the orifice(s) utilized promotes helical flow of the plasma. In one embodiment, the orifice is a continuous fine circumferential slit. In a further embodiment, substrate sleeve 228 integrally forms pressure vessel 238, and the deposition of a film, or the harvesting of particles occurs directly upon substrate sleeve 228, without passage through orifices in a vessel wall.

In one preferred embodiment, the orifices 234/236 are preferably disposed within a cylindrical pressure vessel 238 that creates an appropriate pressure differential to cause the plasma to expand as it contacts the substrate. This expansion, and the subsequent chilling/cooling of the substrate, tends to facilitate certain reactions and limit others. It is preferred to utilize conditions such that only the most stable compound forms are deposited.

Figure 15:
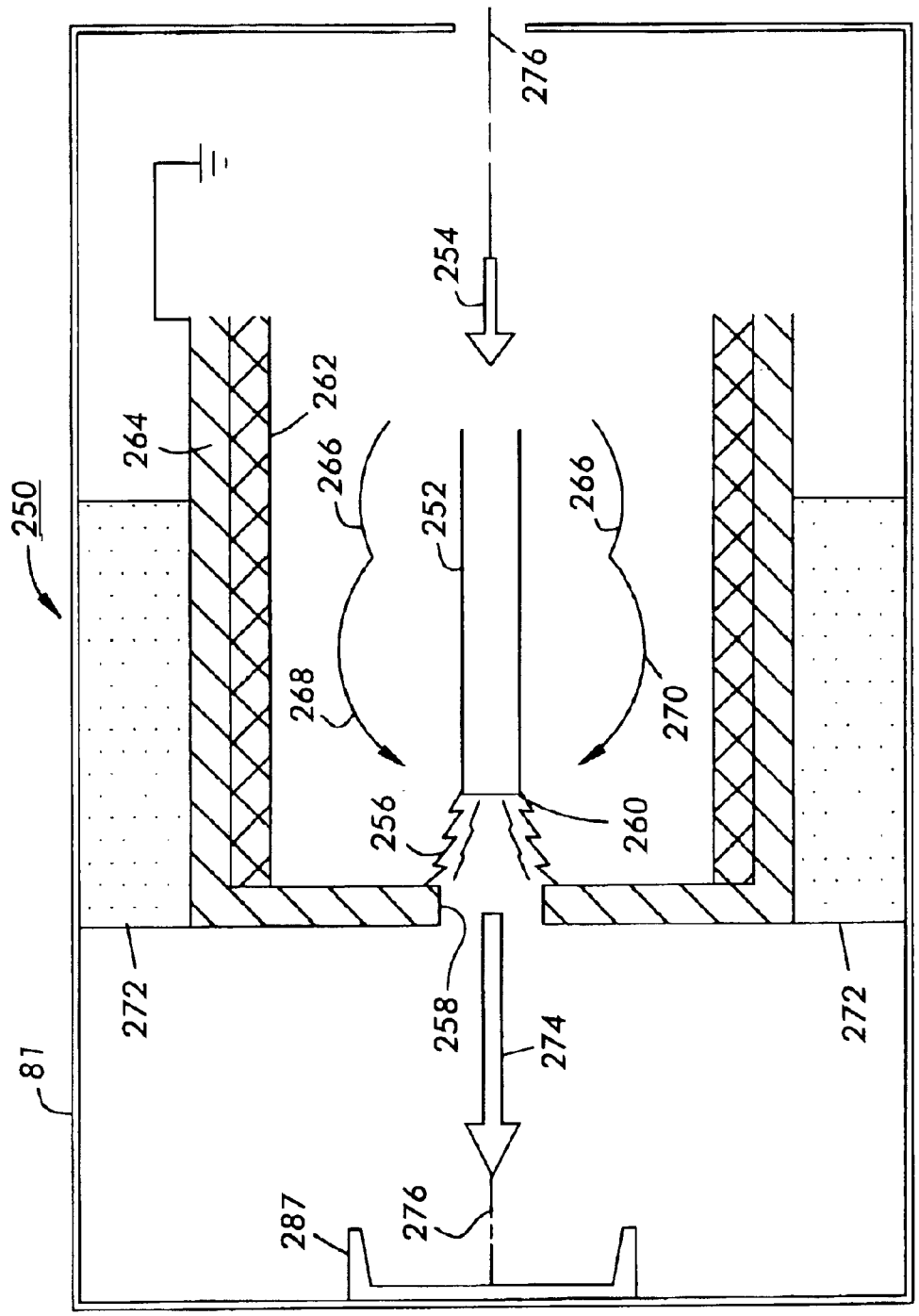
FIG. 15 is schematic representation of a continuous direct current discharge process of the present invention, comprising a first rod-shaped electrode, and a second cylindrical shell electrode.

FIG. 15 is a schematic representation of a continuous direct current discharge process 250. In the embodiment depicted, an electrode 252 is preferably comprised of the cold-pressed fullerene material described elsewhere in this specification. It may be moved in the direction of arrow 254 as it is consumed in the discharge 256 in order to maintain a uniform gap between surfaces 258 and 260. This gap preferably should be maintained at from about 1 to about 5 millimeters, and in one embodiment, control of the gap is automated.

A second stationary electrode, electrode 264, preferably is in the form of a cylindrical shell within which electrode 252 is movably disposed. The electrode 264 preferably consists of a pure, high-temperature metal such as, e.g., tungsten. The metal used should have a melting point in excess of about 1,000 degrees Celsius to prevent its degradation during the discharge process.

In the preferred embodiment depicted in FIG. 15, a ceramic spacer 262 is disposed on the inside surface of electrode 264. The ceramic spacer 262 prevents a discharge from occurring between the electrode 252 and the inner wall of the metal electrode 264. Other insulating materials with high-temperature resistance may be used instead of ceramic. The insulating material, however, should be able to resist a temperature of at least about 800 degrees Celsius without degradation.

A gas mixture 266 is preferably flowed in the direction of arrows 268 and 270. The gas mixture may be the same as described by reference to FIG. 1; thus, e.g., it may be a mixture of inert gas, hydrocarbon gas, and metal carbonyl.

In one preferred embodiment, the gas 266 is flowed into the shell formed by electrode 264 in a manner to create helical flow around electrode 252.

A power supply (not shown) furnishes sufficient energy to electrode 252 to provide a potential difference sufficient to ionize the gas 266. In one embodiment, a voltage of less than 40 volts and a current of less than 100 amperes are utilized.

In the embodiment depicted in FIG. 15, an electromagnet 272 is disposed around the system to focus the plasma beam 274 upon central axis 276. This electromagnet may be created and maintained, e.g., by a direct current of less than 100 amperes and a potential of less than 12 volts.

The focused plasma 274 may be continually harvested on substrate 287; and the material so harvested may be continuously or periodically removed.

In the embodiment depicted, the assembly is disposed within a vacuum chamber 81 whose vacuum properties are described elsewhere in this specification.

The process of the present invention is utilized to produce novel multi-component substances, such as metal alloy films or powders with extremely fine grain structure; metal-metal oxide films doped with organic or covalent molecules; metal-metal oxide particles coated with organic films; organic dyes or pigments encased within a metal oxide matrices; mixed composition semiconductors; multi-layer films on the order of nanometers thick, in which the compositions of the sequential layers alternate or vary in a controlled manner; and the like.

As used herein, the process of the present invention is generally described as applying energy from an energy source upon a target assembly comprising a target material or materials, which produces plasma or plasmas within a generation chamber, while concurrently directing a reagent gas into the generation chamber toward the plasma or plasmas, which mixes with the plasma or plasmas, and which subsequently transports the resulting reactive mixture toward a harvesting device. It is to be understood that there are various energy sources, and a vast array of candidate target materials and reagent gases which may be selected as reactants, to be considered within the scope of the present invention. Accordingly, a considerable range of multi-component materials is produced by the process of the present invention.

For example, the target materials upon which energy is directed is the source of the multiple components of the novel materials of the present invention. In various embodiments, target materials are at least 80 weight percent of a single component wherein the single component is an atomic elemental substance, or a molecular substance. In one embodiment shown in FIG. 1, a target assembly 33 comprises electrodes 34 and 36, which comprise different materials, and are therefore the sources of multiple components in the materials of the present invention. In an alternative embodiment, electrodes 34 and 36 each comprise materials of multiple components. For example, electrodes 34 and 36 may be of carbon and/or fullerene, and metal, as shown in FIGS. 13A and 13B, and described previously in this specification.

Figure 16:
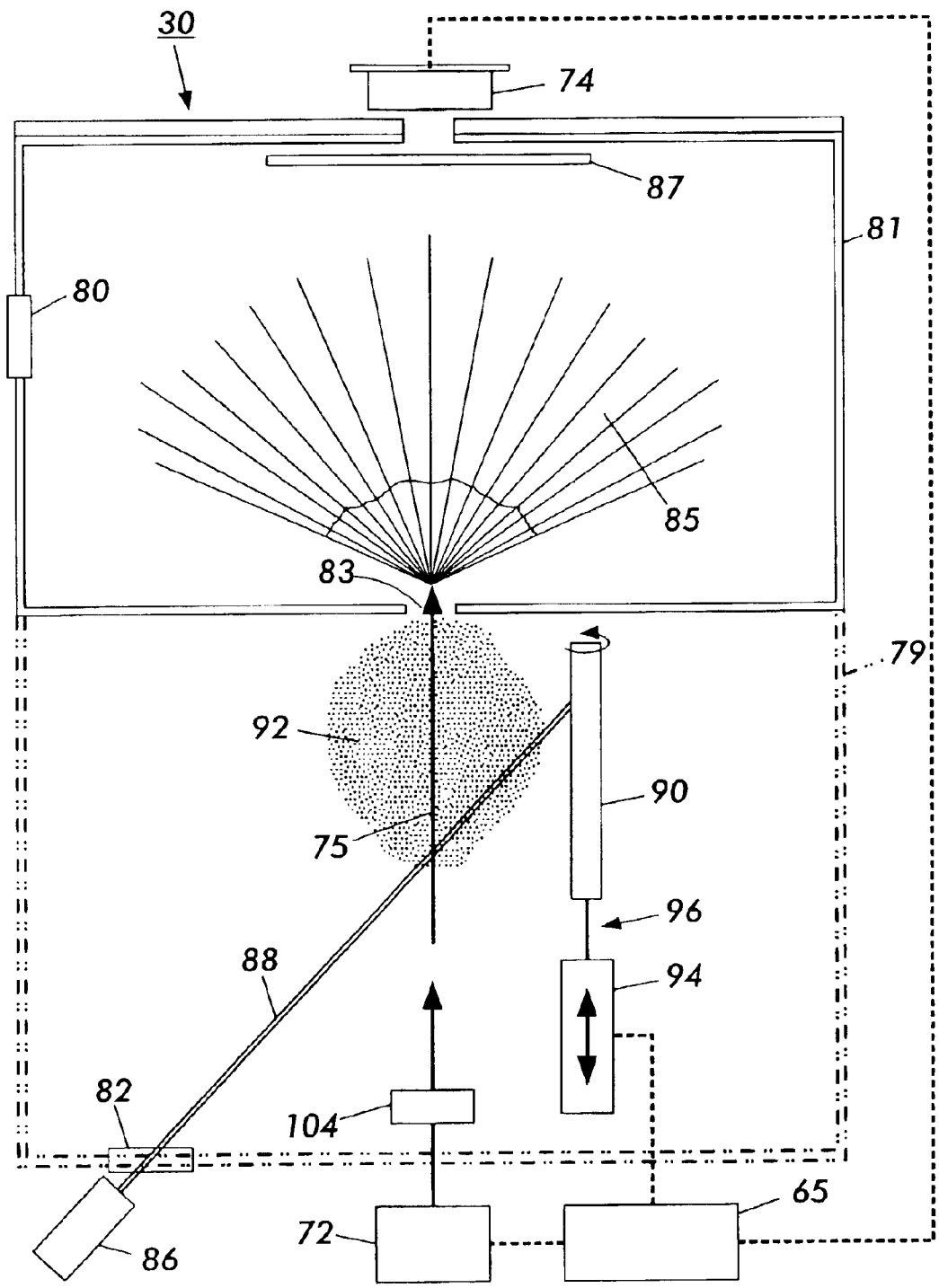
FIG. 16 is a schematic representation of one preferred process for carrying out laser assisted molecular beam deposition (LAMBD), for making multi-component substances, in accordance with the present invention.

In a further embodiment known as laser assisted molecular beam deposition (LAMBD), shown in FIG. 16, a laser 86 is used as an energy source, and is directed at a target assembly 96 comprised of a drive 94 and a target rod 90. Referring to FIG. 16, laser 86 produces laser beam 88, which is directed through window 82 into chamber 79. Laser beam 88 impinges upon target rod 90, preferably at an oblique angle of between 20 and 90 degrees, and produces ablated material 92. Laser 86 preferably produces a pulsed laser beam. Accordingly, controller 65 operates pulsed valve 104 such that pulses of gas from gas supply 72 are delivered in a synchronous manner with pulsed laser beam 88, in a manner similar to that in which a pulsed arc is synchronized with a pulsed gas supply in the practice of pulsed arc molecular beam deposition, as described previously in this specification.

Reagent gas pulses from gas supply 72 transport the ablated material 92 as indicated by arrow 75 through orifice 83, and onto substrate 87 as was described previously for the practice of pulsed arc molecular beam deposition. In some embodiments, reagent gas may also react with ablated material 92 to produce the desired reaction products 85.

During the laser assisted molecular beam deposition process of the present invention, target rod 90 is preferably rotated about and translated along its axis by drive 94, which is controlled by controller 65. Such preferable rotation provides a fresh surface of target rod 90, upon which laser beam 88 impinges, thereby maintaining the resulting ablated material 92 at a constant composition. The target rotation speed is determined by the laser and gas pulse frequency, laser spot size, and target rod dimensions. In one embodiment, target rod 90 is rotated at between 1 and 10 revolutions per minute, and target rod 90 is axially translated at between 0.5 and 10 millimeters per minute. Target rod 90 is preferably a cylindrical rod, in a size between 10 and 50 millimeters in length and between 1 and 20 millimeters in diameter. In a further embodiment, a laser with a 0.1 mm spot size is used to ablate a 1 mm diameter rod, wherein said rod is rotated 12 degrees about its axis per each 0.003 mm of axial translation; i.e. the rod is axially indexed one laser spot size per revolution.

In one embodiment, the production of a multi-component material of the present invention is performed by using a target rod, which comprises a plurality of component materials. For example, target rod 90 may be of a metal alloy, or target rod 90 may be of a sintered aggregate of carbon/fullerene metal mixed with one or more of metals such as nickel, iron, cobalt, molybdenum and thereafter heated to form a homogeneous sintered mass, as described previously in this specification.

Figure 17:
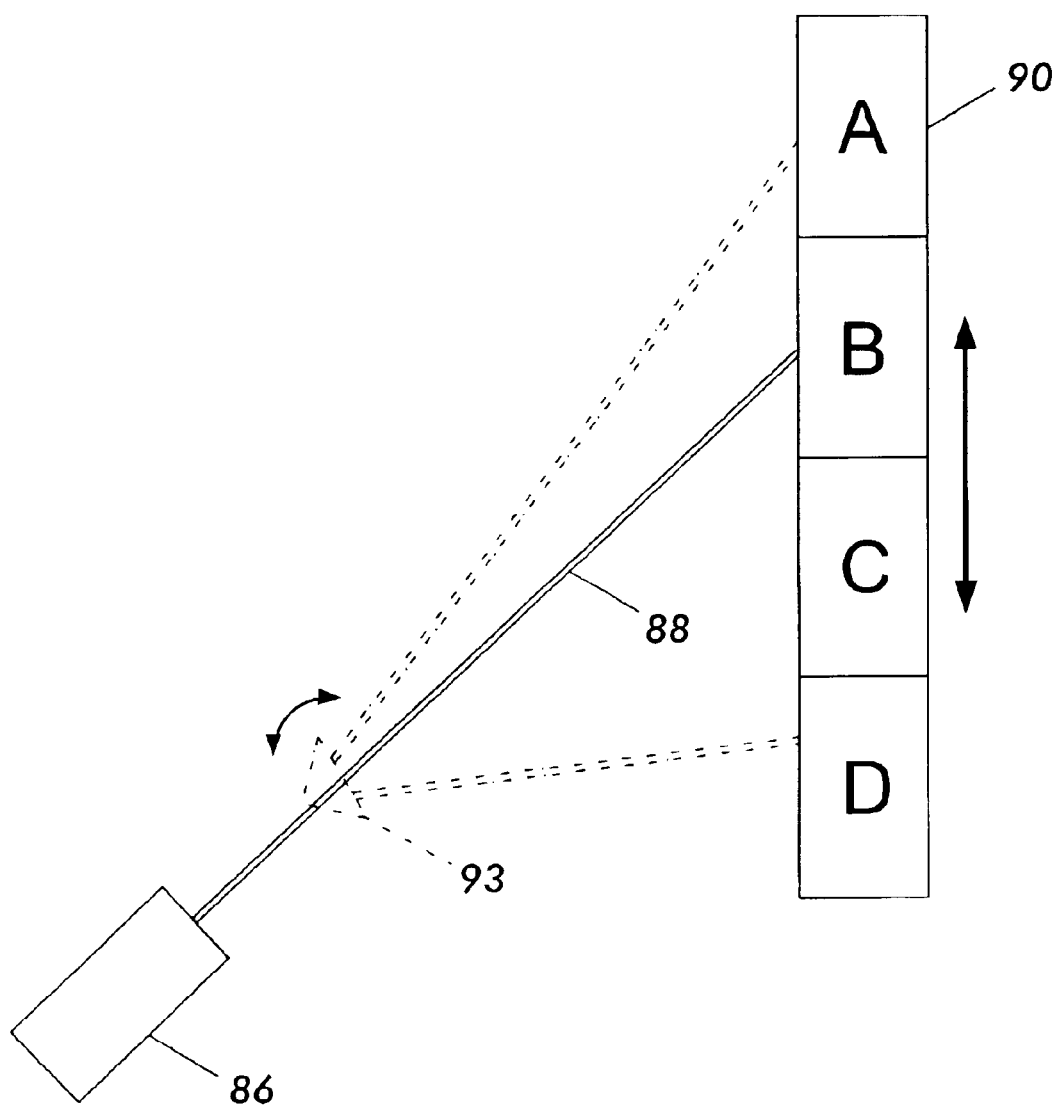
FIG. 17 is a side elevation view of a multi-component target rod utilized in one embodiment of laser assisted molecular beam deposition.

In one further embodiment shown in FIG. 17, target rod 90 may be of varying composition, comprising component materials identified as "A", "B", "C", and "D". In the process shown in FIG. 17, laser beam 88 is scanned along the axis of target rod 90 by moving laser beam 88 and target rod 90 relative to each other, such that materials comprising components A, B, C, and D, are sequentially ablated. Alternatively, laser beam 88 is directed along target rod 90 by beam steering optical element 93. Such beam steering elements are well known in the art. Beam steering optical element 93 could be e.g., a rotatable prism. Accordingly, a multi-component layered film upon substrate 87 of FIG. 16 is produced, comprising in sequence, components A, B, C, and D, when beam 88 is directed along the full length of target rod 90, traversing from material A to material D. With proper selection of process conditions, the resulting thickness of said sequential layers is on the order of nanometers, thus producing an overall film upon substrate 87 with a controlled nanostructure. In one embodiment, the thickness of each of layers comprising components A, B, C, and D is between 0.1 and 100,000 nanometers.

Figure 18:
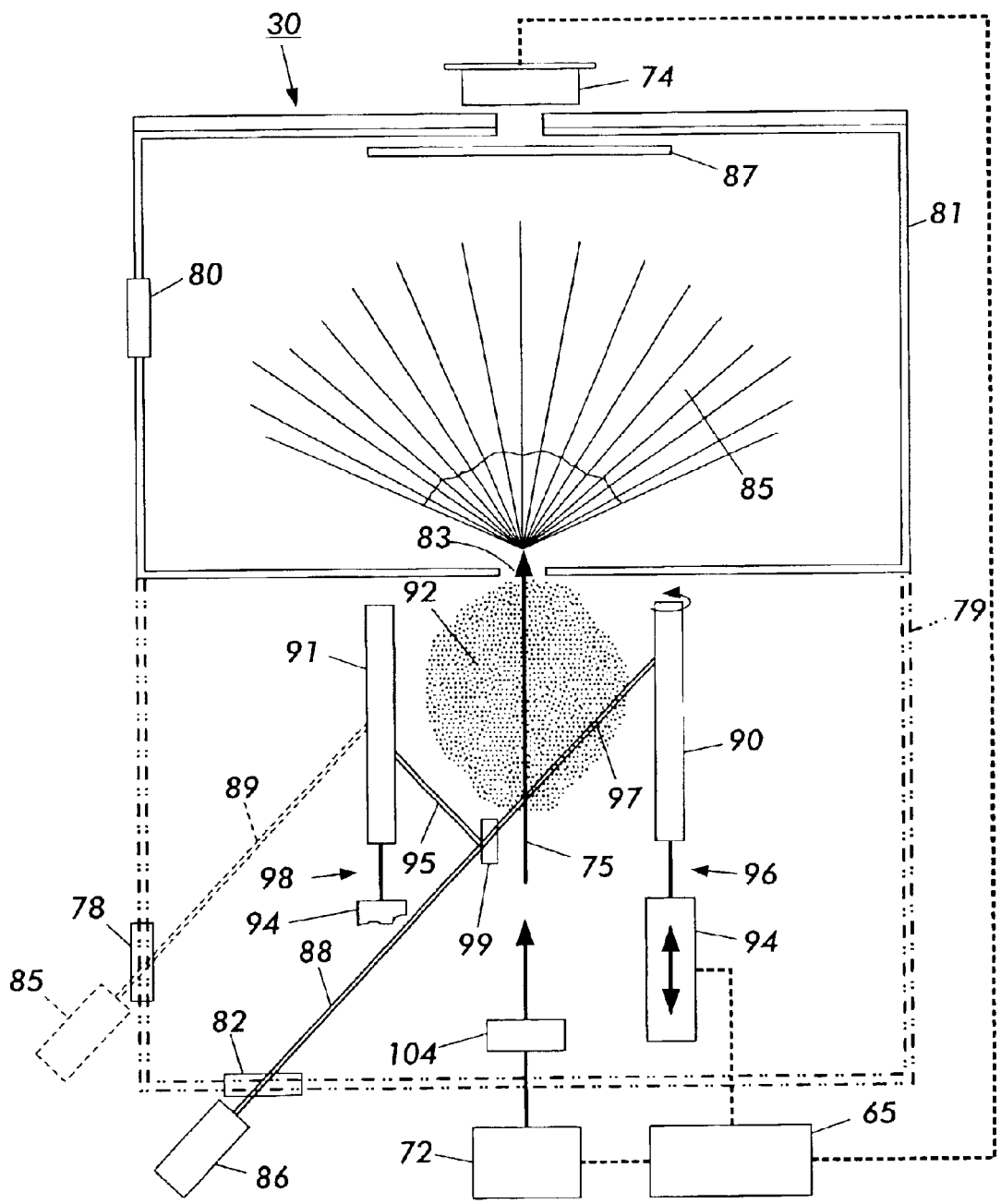
FIG. 18 is a schematic representation of an alternative process for carrying out laser assisted molecular beam deposition (LAMBD), comprising multiple or split laser beams, for simultaneous coating of multicomponent films, or for coating of films of alternating composition.

In a further embodiment depicted in FIG. 18, laser beam 88 is split into at least two beams 95 and 97 by beam-splitting optical element 99, and is directed at a first target assembly 96, and a second target assembly 98. Laser beam 97 is directed to impinge upon a first target rod 90, and laser beam 95 is directed to impinge upon a second target rod 91. Target rods 90 and 91 are of different material compositions, resulting in the synthesis of multi-component materials. Optical element 99 may be one of several known optical devices for splitting a laser beam, such as a partially transmissive and partially reflective mirror, a prism, a diffraction grating, a hologram, and the like. Optical element 99 may split laser beam 88 continuously into beams 95 and 97, or alternatively, optical element 99 may also function as a shutter, wherein beam 88 is directed to target rod 91 as beam 95, and then directed to target rod 90 as beam 97, in an alternating manner.

In an alternative embodiment, a second laser 85 directs beam 89 through window 78, to impinge upon target rod 91. In this embodiment, laser 85 may optionally be of a different wavelength and power than laser 86, wherein each of lasers 85 and 86 are selected such that they ablate target rods 91 and 90, respectively, in an optimum manner.

In yet a further embodiment of the present invention, the pulsed arc molecular beam process described previously in this specification and shown in FIG. 1 is provided with additional target material electrodes beyond electrodes 34 and 36 of FIG. 1. FIGS. 21A–21F are schematic representations of various embodiments of pulsed arc electrodes of the present invention. FIGS. 21A, 21C, 21D, and 21F are elevation views of a portion of the pulsed arc molecular beam process, taken from within chamber 79 of FIG. 1, along line 21—21.

Figure 21A:
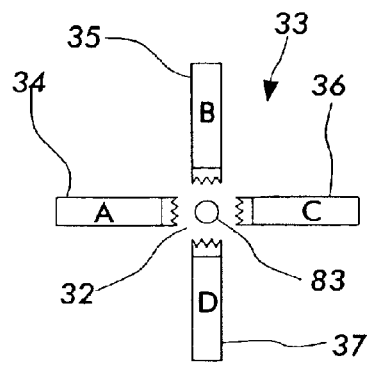
FIGS. 21A–21F are schematic representations of various embodiments of pulsed arc electrodes of the present invention, used for performing pulsed arc molecular beam deposition.

Referring to FIG. 21A, in one embodiment, two additional electrodes 35 and 37 are disposed proximate to area 32, such that these additional electrodes are orthogonal to electrodes 34 and 36, and orthogonal to the general direction of the gas flow from the gas supply (not shown). These two additional electrodes 35 and 37, in conjunction with electrodes 34 and 36, substantially form a cross, centered at area 32, which comprises target assembly 33.

In a further embodiment, the four electrodes 34, 35, 36, and 37 comprise four different component materials A, B, C, and D, and the high voltage power is supplied to various combinations of the four electrodes, such that multiple combinations of target materials are ablated into area 32. e.g. Material combinations AB, AC, AD, BC, BD, and CD, and the like are introduced into plasma 300 of FIG. 9.

Figure 21B:
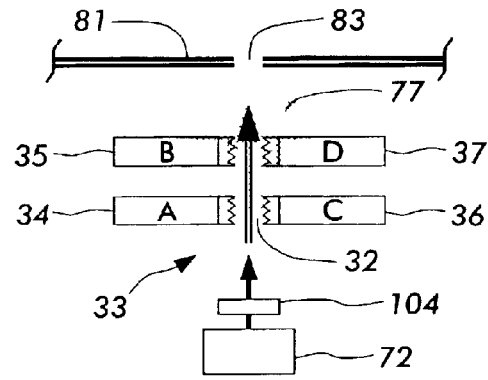
Figure 21C:
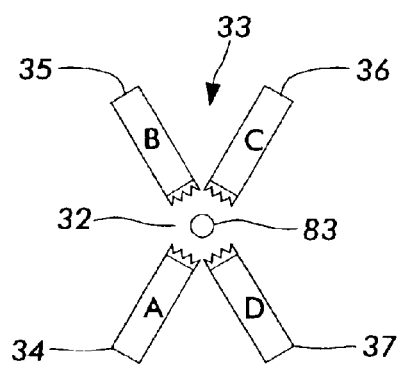
Figure 21D:
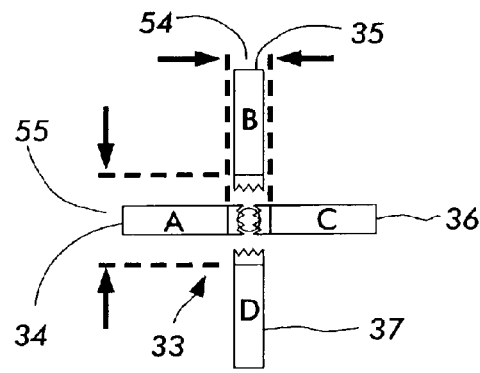
Figure 21E:
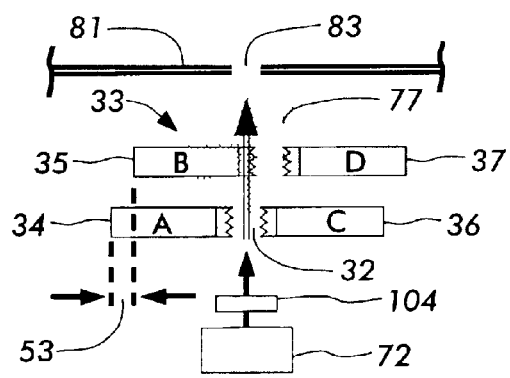

Referring to FIG. 21B, and in a further embodiment, electrode pair 35/37 is disposed from electrode pair 34/36 in substantially the same plane as electrode pair 34/36, but downstream with respect to the flow of reagent gas from gas supply 72. Referring to FIG. 21E, in another embodiment, electrode pair 35/37 is offset by distance 53, such that the plasma generated from the pulsed arcing between electrodes 34 and 36 preferentially bathes the tip of electrode 35, rather than the general area between electrodes 35 and 37. In other embodiments, the respective distances between electrode pairs are varied. For example, in FIG. 21D, electrodes 34 and 36 are separated by gap 54, while electrodes 35 and 37 are separated by gap 55.

Figure 21F:
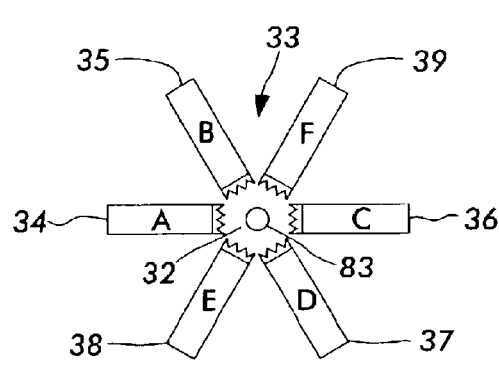

Other configurations of additional electrodes are also encompassed by the present invention. For example, a hexagonal array of electrodes 34, 35, 36, 37, 38, and 39 is depicted in FIG. 21F. It will be apparent that FIGS. 21A–21F depict target assemblies 33 for illustrative purposes only, and that pulsed arcing electrodes of the present invention are not required to be disposed in a single plane, or orthogonal to the flow of reagent gas from the gas supply. Rather, said electrodes may be disposed of in any arrangement that is practical with regard to overall equipment design and fabrication methods, with the operative requirement being that said electrodes are positioned sufficiently proximate to each other, such that arcing is enabled therebetween, and plasma is generated therefrom.

In yet a further embodiment of the present invention, reagent gas 308 of FIG. 9 is a source of one or more components in the synthesis of multi-component materials by the present invention, as described previously in this specification. In one embodiment, reagent gas 308 comprises a single component gas delivered from a single source (not shown). As used herein, a single component gas is used to denote a gas, which consists essentially of one gas, and having small amounts of impurities, which have no effect on the functional use of the gas in the intended application.

In another embodiment, reagent gas comprises a multi-component gas delivered from a single source. In a third embodiment, reagent gas is provided from a plurality of sources (not shown), and comprises gases comprising multiple components such as steam, nitrogen, oxidant gases (e.g. $O_2$ and $O_3$), halogen gases (e.g. $I_2$, $Br_2$, $Cl_2$ and $F_2$), flammable gases (e.g. $CH_4$, $C_2H_6$, $C_3H_8$, $C_2H_2$), acid gases (e.g. HCl), basic gases (e.g. $NH_3$), hydride gases (e.g. $H_2$, $PH_5$, $SiH_4$, $AsH_3$), metalo-organic gases, (e.g. $(CH_4)_4Ga$), metal carbonyl gases (e.g. $Ni(CO)_5$, $Fe(CO)_5$, $Co(CO)_5$), and the like.

Figure 19:
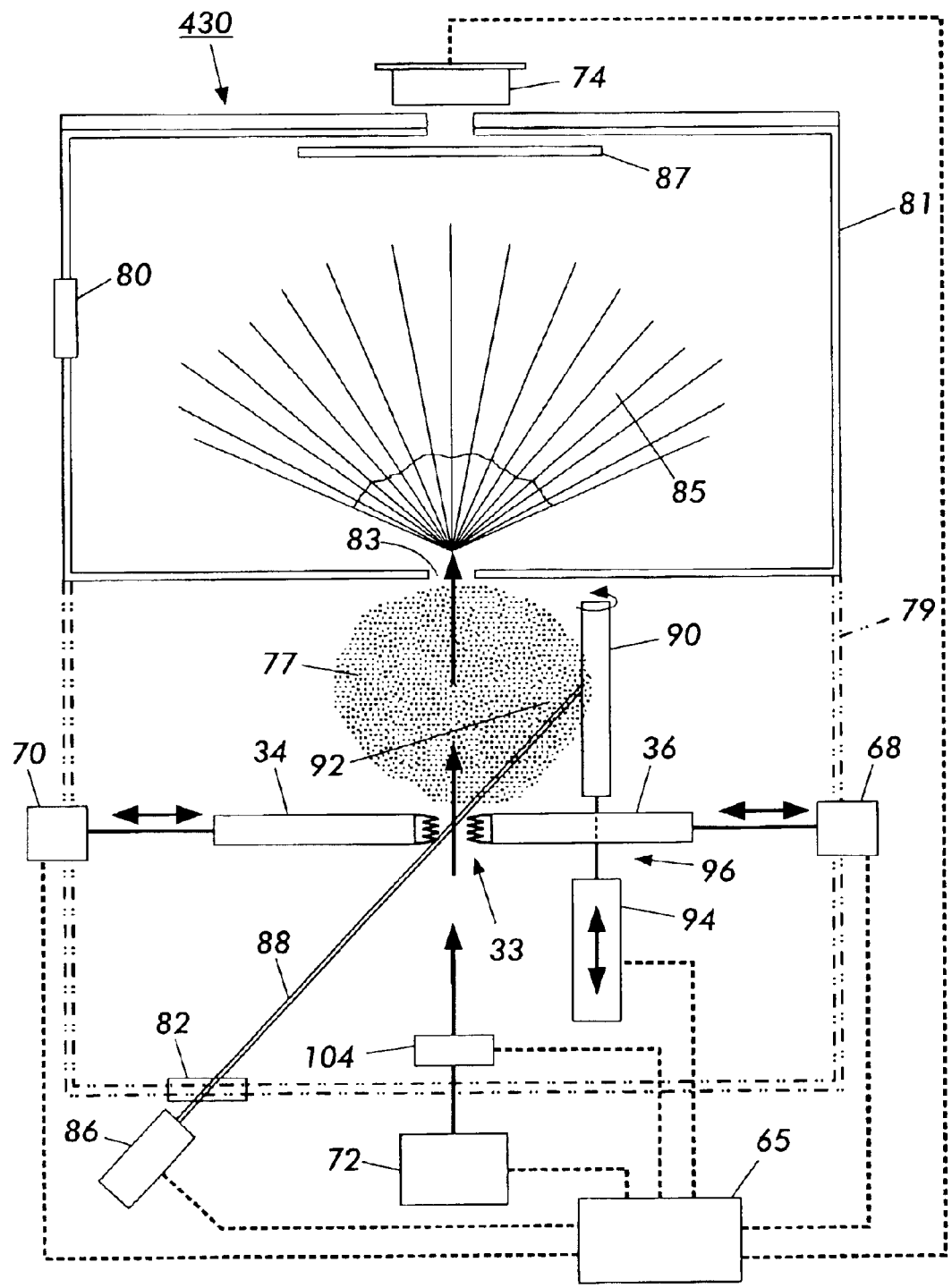
FIG. 19 is a schematic representation of an alternative process for carrying out molecular beam deposition comprising at least one laser, and at least one pair of electrodes as plasma generation sources.

In another embodiment shown in FIG. 19, a hybrid assisted molecular beam process 430 is depicted, comprising at least one laser 86 directed at laser target assembly 96, and one electrode target assembly 33 comprising electrodes 34 and 36 as means for generating plasma. Referring to FIG. 19, pulsed arc molecular beam deposition is performed by pulsed arcing between electrodes 34 and 36, and laser assisted molecular beam deposition is performed by impingement of laser beam 88 upon target rod 90, as previously described in this specification. In a first embodiment, the pulsing of laser beam 88 and the pulsed arcing between electrodes 34 and 36 is done concurrently, wherein plasma 300 (see FIG. 9) comprises highly excited molecular, atomic, and/or ionic species originating from ablated electrodes 34 and/or 36, target rod 90, and/or gas supply 72. In a second embodiment, pulsed arcing between electrodes 34 and 36 is performed for a first time interval, alternating with pulsed lasing of beam 88 upon target rod 90 for a second time interval. In such an embodiment, reaction products 85 alternatingly comprise materials from plasma produced from electrodes 34 and 36 and gas supply 72, and target rod 90 and gas supply 72. It will be apparent that in such an embodiment, reagent gas from gas supply 72 may be reagent gas provided from at least two sources (not shown), wherein a first gas is pulsed during the pulsing of electrodes 34 and 36, and a second gas is pulsed during the pulsing of laser 86. It will be further apparent that the spatial arrangement of electrodes 34 and 36, laser 86, target rod 90, and other apparatus components is for illustrative purposes only, and that other alternate arrangements are possible, depending upon the specific materials being processed. The operative requirements of the process depicted in FIG. 19 are that electrodes 34 and 36 are sufficiently proximate to each other to enable pulsed arcing therebetween, and that laser 86 directs beam 88 to impinge upon target rod 90.

Figure 20:
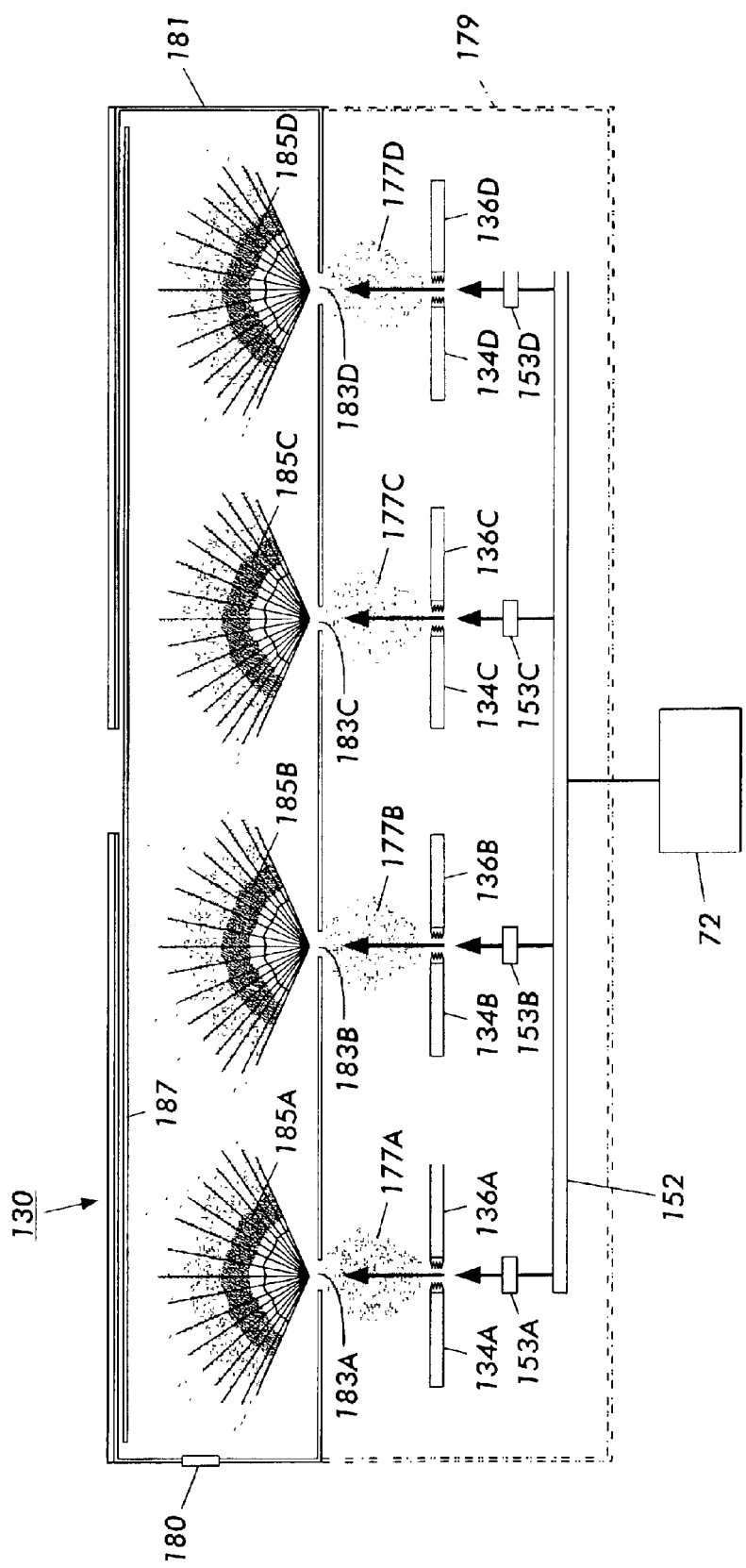
FIG. 20 is a schematic representation of an alternative process for performing pulsed arc molecular beam deposition (PAMBD), comprising multiple pulsed arc sources, for coating large area or multiple substrates, or harvesting particles at a higher production rate.

It will be apparent that embodiments of the present invention may comprise a plurality of energy sources operating in parallel, which generate plasma 300 of FIG. 9, for the purpose of depositing films upon a larger area, or for producing particles at a higher rate. Embodiments may comprise a plurality of lasers directed at a single target rod or multiple target rods, or a plurality of electrode pairs operated simultaneously, or some combination thereof. One such embodiment is depicted in FIG. 20. Referring to FIG. 20, process 130 comprises four pairs of electrodes 134A/136A through 134D/136D. Gas supply 72 is divided into four streams by manifold 152, and is discharged to said electrode pairs by pulsed valves 153A–153D. Plasma is generated at each electrode pair and forms reaction products during its convection through quench areas 177A–177D. Reaction products 185A–185D are subsequently discharged through orifices 183A–183D, and are deposited as a film upon large area substrate 187, or are harvested as fine particles from a harvesting device (not shown).

In a further embodiment, a harvesting device comprising a substrate is provided with additional apparatus to enhance the harvesting of the multi-component substance. Referring to FIG. 1, substrate 87 comprises, e.g. a circular wafer, and is rotated continuously by a spinner (not shown) during deposition of a film of a multi-component substance. In yet another embodiment, substrate 87 is warmed by a heater (not shown). In one embodiment of the present invention, a new multi-component composition of matter comprising a metal oxide film doped with organic molecules is synthesized. Such materials are particularly useful in embedding an optically active component is a structurally robust matrix.

In one embodiment of the present invention, a new multi-component composition of matter comprising an organic dye encased within a metal oxide matrix is synthesized. Such materials are particularly useful as filters and other optical components. Referring to FIGS. 1 and 2, to synthesize such a material using the pulsed arc molecular beam process of the present invention, a target material anode 34 comprising titanium metal and a target material cathode 36 comprising titanium metal are fitted in a housing (not shown) in six way cross 112. Direct current power supply 108 applies voltage pulses of between 100 and 2000 volts, and preferably pulses of about 1000 volts across anode 34 and cathode 36 at a frequency of between 0.5 and 5.0 Hz, and preferably at about 2 Hz. Concurrently, pulses of reagent gas from gas supply 72 comprising pure oxygen ($O_2$) gas are introduced in phase with said voltage pulses as described previously in this specification. Organic dye is introduced into the process by sublimation, using a separate heater and gas port (not shown).

Referring to FIG. 9, these prescribed process conditions produce reactive plasma 300 comprising highly excited titanium atoms and titanium ions which react with the $O_2$ gas as follows:

$$Ti + O_2 \xrightarrow{M} TiO_2$$

with the resulting products being the organic dye distributed throughout the $TiO_2$ matrix at a concentration on the order of a few percent. Said resulting products 330 may be deposited as a film or collected as a powder on harvesting device 320, depending on the exact process configuration.

In one embodiment of the present invention, a new multi-component composition of matter comprising a mixed composition semiconductor is synthesized. Such materials are particularly useful as tunable band gap semiconductors. Referring to FIG. 1, FIG. 2, and FIG. 21A, to synthesize such a material using the pulsed arc molecular beam process of the present invention, a first pair of target material electrodes 34 and 36 comprising scandium metal and a second pair of target material electrodes 35 and 37 comprising gallium metal, are fitted preferably substantially orthogonal to each other in a housing (not shown) in six way cross 112. Direct current power supply 108 applies voltage pulses of between 100 and 2000 volts, and preferably pulses of about 1000 volts across scandium electrodes 34 and 36 and gallium electrodes 35 and 37 at a frequency of between 0.5 and 5.0 Hz, and preferably at about 2 Hz. Concurrently, pulses of reagent gas from gas supply 72 consisting essentially of nitrogen ($N_2$) are introduced synchronously with said voltage pulses as described previously in this specification.

Referring to FIG. 9, these prescribed process conditions produce reactive plasma 300 comprising excited gallium and scandium atoms and ions and subsequent mixture, which react to produce a composition having the general formula $Sc_{1-n}Ga_nN$ where n is between 0 and 1. Depending on the ablation conditions, this stoichiometry of this compound ranges from pure ScN to pure GaN, and any desired mixed composition therebetween.

In one embodiment of the present invention, a new multi-component composition of matter comprising a mixed composition semiconductor is synthesized. Such materials are particularly useful as low pass, high pass, or cutoff optical filters, or sensor elements. Referring to FIG. 1, FIG. 2, and FIG. 21A, to synthesize such a material using the pulsed arc molecular beam process of the present invention, a first pair of target material electrodes 34 and 36 comprising cerium metal and a second pair of target material electrodes 35 and 37 comprising silicon are fitted preferably substantially orthogonal to each other in a housing (not shown) in six way cross 112. Direct current power supply 108 applies voltage pulses of between 100 and 2000 volts, and preferably pulses of about 1000 volts across cerium electrode pair 34 and 36 and silicon electrode pair 35 and 37 at a frequency of between 0.5 and 5.0 Hz, and preferably at about 2 Hz.

In one preferred embodiment, cerium and silicon electrode pairs are not pulsed simultaneously, but rather in alternating sequence. Reagent gas supply 72 comprises a source of oxygen ($O_2$) gas and a source of inert gas such as helium, or argon. Concurrently with the pulsing of the cerium electrodes 34 and 36, pulses of oxygen gas from gas supply 72 are introduced synchronously with said voltage pulses applied to the cerium electrodes 34 and 36. In like manner, concurrently with the pulsing of the silicon electrodes 35 and 37, pulses of argon, helium, or other inert gas from gas supply 72 are introduced synchronously with said voltage pulses applied to the silicon electrodes 35 and 37.

Referring to FIG. 9, these prescribed process conditions produce reactive plasma 300. During the pulsed electrical discharge of the cerium electrodes 34 and 36, concurrent with pulses of $O_2$ gas, highly excited cerium atoms and cerium ions are produced (where n is between 1 and 4), which react with the $O_2$ gas as follows:

$$Ce + O_2 \longrightarrow CeO_2$$

Referring to FIG. 1, the $CeO_2$ is coated as a thin film upon substrate 87, within chamber 81.

During the pulsed electrical discharge of the silicon electrodes 35 and 37, concurrent with pulses of inert gas, highly excited silicon atoms and ions are produced. Such species, of course, do not react with the inert gas and are instead coated as a pure silicon film upon substrate 87, within chamber 81.

Accordingly, the resulting product is a multi-layered thin film of silicon deposited over the cerium oxide insulating layer. The thickness of each layer may be selected to match the particular thin film application. The duration of the pulsing of the cerium electrode pair and the silicon electrode pair determines the respective thicknesses of the $CeO_2$ and Si layers, respectively, along with other parameters such as the pulsed arc voltage and current, and the size and/or surface area of the electrode tips.

In recapitulation, the present invention is a process for preparing multi-component substances. The invention has been described with respect to preferred embodiments. However, as those skilled in the art will recognize, modifications and variations in the specific details, which have been described and illustrated, may be resorted to without departing from the spirit and scope of the present invention. It is to be understood, therefore, that the aforementioned description is illustrative only and that changes can be made in the apparatus, in the ingredients and their proportions, and in the sequence of combinations and process steps, as well as in other aspects of the invention discussed herein, without departing from the scope of the invention as defined in the following claims.

We claim:

1. A method for harvesting a multi-component substance with a harvesting device, comprising the steps of:
    (a) applying energy from an energy source to a first target assembly wherein said first target assembly is comprised of a first material and a second material;
    (b) ablating said first material from said first target assembly and generating a first plasma having a temperature of at least 2000 degrees Centigrade;
    (c) ablating said second material from said first target assembly and generating a second plasma having a temperature of at least 2000 degrees Centigrade;
    (d) discharging a flow of reagent gas from a gas supply toward said first plasma;

(e) discharging a flow of reagent gas from a gas supply toward said second plasma;

(f) reacting said first plasma and said second plasma to produce a multi-component substance;

(g) discharging a flow of reagent gas from a gas supply toward said harvesting device; and (h) harvesting said multi-component substance with said harvesting device.

2. The method as recited in claim 1,, wherein said energy source comprises a first laser.

3. The method as recited in claim 2, wherein said first target assembly is unitary.

4. The method as recited in claim 3, wherein said unitary target comprises a first section comprising a first material joined to a second section comprising a second material.

5. The method as recited in claim 2, wherein said target assembly comprises a first target comprising a first material, and a second target comprising a second material.

6. The method as recited in claim 3 or claim 5, wherein said first material and said second material are comprised of at least about 80 weight percent independently selected from the group consisting of aluminum, silicon, titanium, vanadium, chromium, manganese, iron, nickel, copper, zinc, palladium, gold, silver, cerium, zirconium, and hafnium, compounds thereof, alloys thereof, and mixtures thereof.

7. The method as recited in claim 6, wherein said reagent gas consists essentially of nitrogen.

8. The method as recited in claim 6, wherein said reagent gas consists essentially of oxygen.

9. The method as recited in claim 6, wherein said reagent gas consists essentially of a noble gas.

10. The method as recited in claim 3 or claim 5, wherein said First material and said second material are comprised of at least about 80 weight percent independently selected from the group consisting essentially of silicon, gallium, scandium, and arsenic, and compounds and mixtures thereof.

11. The method as recited in claim 10, wherein said reagent gas consists essentially of nitrogen.

12. The method as recited in claim 10, wherein said reagent gas consists essentially of a noble gas.

13. The method as recited in claim 3 or claim 5, wherein said first material consists essentially of titanium and said second material consists essentially of carbon.

14. The method as recited in claim 2, wherein said laser is a pulsed laser.

15. The method as recited in claim 14, wherein said, gas flow is a pulsed gas flow operated synchronously with said pulsed laser.

16. The method as recited in claim 2, wherein said first target assembly and said harvesting device are disposed in a first vacuum chamber.

17. The method as recited in claim 2, wherein said first target assembly is disposed in a first vacuum chamber, and said harvesting device is disposed in a second vacuum chamber, and wherein said first vacuum chamber is connected to said second vacuum chamber by an orifice.

18. The method as recited in claim 1, wherein said energy source is a direct current power supply with at least 100 volts, said target assembly comprises a first electrode and a second electrode operatively connected to said power supply, and wherein said steps of ablating said first and second materials and generating said first plasma and said second plasma further comprises causing an arcing electrical discharge between said electrodes.

19. The method as recited in claim 18, wherein each of said first electrode comprises said first material and said second material, and said second electrode comprises said first material and said second material.

20. The method as recited in claim 18, wherein said first electrode comprises said first material, and said second electrode comprises said second material.

21. The method as recited in claim 19 or claim 20, wherein said first material and said second material are independently selected from the group consisting of aluminum, silicon, titanium, vanadium, chromium, manganese, iron, nickel, copper, zinc, palladium, gold, silver, cerium, zirconium, and hafnium, compounds thereof, alloys thereof, and mixtures thereof.

22. The method as recited in claim 21, wherein said reagent gas consists essentially of nitrogen.

23. The method as recited in claim 21, wherein said reagent gas consists essentially of oxygen.

24. The method as recited in claim 21, wherein said reagent gas consists essentially of a noble gas.

25. The method as recited in claim 19 or claim 20, wherein said first material and said second material are independently selected from the group consisting of silicon, gallium, scandium, and arsenic, and compounds and mixtures thereof.

26. The method as recited in claim 25, wherein said reagent gas consists essentially of nitrogen.

27. The method as recited in claim 25, wherein said reagent gas consists essentially of a noble gas.

28. The method as recited in claim 19 or claim 20, wherein said first material consists essentially of titanium and said second material consists essentially of carbon.

29. The method as recited in claim 18, wherein said arcing electrical discharge is a pulsed electrical discharge.

30. The method as recited in claim 29, wherein said gas flow is a pulsed gas flow operated synchronously with said pulsed electrical discharge.

31. The method as recited in claim 18, wherein said first target assembly and said harvesting device are disposed in a first vacuum chamber.

32. The method as recited in claim 18, wherein said first target assembly is disposed in a first vacuum chamber, said harvesting device is disposed in a second vacuum chamber, and said first vacuum chamber is connected to said second vacuum chamber by an orifice.

33. The method as recited in claim 18, wherein each of said first electrode and said second electrode is a hallow electrode, and wherein gas from said reagent gas supply is flowed through the center of said first electrode and the center of said second electrode.

34. A method for harvesting a multi-component substance with a harvesting device, comprising the steps of:

a) applying energy from an energy source comprising a direct current power supply of at least 100 volts potential to a first target assembly comprised of a first electrode and a second electrode;

b) ablating material from said first target assembly and generating a plasma having a temperature of at least 2000 degrees Centigrade by causing an arcing electrical discharge between said first electrode and said second electrode;

c) discharging a flow of reagent gas from a gas supply toward said plasma d) reacting said plasma and said reagent gas to produce a multi-component substance;

e) discharging a flow of reagent gas from a gas supply toward said harvesting device;

f) harvesting said multi-component substance with said harvesting device.

35. The method as recited in claim 34, wherein said gas supply comprises a single vessel comprising a mixture of a first gas and a second gas.

36. The method as recited in claim 34, wherein said gas supply comprises a first vessel comprising a first gas, and a second vessel comprising a second gas.

37. The method as recited in claim 35 or claim 36, wherein said first gas consists essentially of a reactive gas and said second gas consists essentially of an inert gas.

38. The method as recited in claim 35 or claim 36, wherein said first gas consists essentially of a first reactive gas, and said second gas consists essentially of a second reactive gas.

39. The method as recited in claim 34, wherein said first target assembly and said harvesting device are disposed in a first vacuum chamber.

40. The method as recited in claim 34, wherein said first target assembly is disposed in a first vacuum chamber, said harvesting device is disposed in a second vacuum chamber, and said first vacuum chamber is connected to said second vacuum chamber by an orifice.

41. The method as recited in claim 34, wherein said arcing electrical discharge is a pulsed electrical discharge.

42. The method as recited in claim 41, wherein said gas flow is a pulsed gas flow operated synchronously with said pulsed electrical discharge.

43. The method as recited in claim 34, wherein said first target assembly and said harvesting device are disposed in a first vacuum chamber.

44. The method as recited in claim 34, wherein said first target assembly is disposed in a first vacuum chamber, said harvesting device is disposed in a second vacuum chamber, and said first vacuum chamber is connected to said second vacuum chamber by an orifice.

45. The method as recited in claim 34, wherein each of said first electrode and said second electrode is a hollow electrode, and wherein gas from said gas supply is flowed through the center of said first electrode and the center of said second electrode.

46. The method as recited in claim 45, wherein said gas supply comprises a single vessel comprising a mixture of a first gas and a second gas.

47. The method as recited in claim 45, wherein said reagent gas supply comprises a first vessel comprising a first gas and a second vessel comprising a second gas.

48. The method as recited in claim 47, wherein said first gas is flowed through the center of said first electrode, and said second gas is flowed through the center of said second electrode.

49. A method for harvesting a multi-component substance with a harvesting device, comprising the steps of:
   a) applying energy from a laser to a first laser target assembly comprised of a first material;
   b) applying a voltage from a direct current power supply with at least 100 volts to a first target electrode and a second target electrode;
   c) ablating said first material from said laser target assembly and generating a first plasma having a temperature of at least 2000 degrees Centigrade;
   d) ablating said first and second electrodes and generating a second plasma having a temperature of at least 2000 degrees Centigrade;
   e) discharging a flow of reagent gas from a gas supply toward said first plasma;
   f) discharging a flow of reagent gas from a gas supply toward said second plasma;
   g) reacting said first plasma and said second plasma to produce a multi-component substance;
   h) discharging a flow of reagent gas from a gas supply toward said harvesting device; and
   i) harvesting a multi-component substance with said harvesting device.

* * * * *